US012796471B2

(12) United States Patent
Kim et al.

(10) Patent No.: US 12,796,471 B2
(45) Date of Patent: Nov. 10, 2026

(54) SEMICONDUCTOR MEMORY DEVICE WITH GUARD REGION STACK STRUCTURE AND FABRICATION METHOD

(71) Applicant: SK hynix Inc., Icheon-si (KR)

(72) Inventors: Jae Taek Kim, Icheon-si (KR); Hye Yeong Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 987 days.

(21) Appl. No.: 17/953,987

(22) Filed: Sep. 27, 2022

(65) Prior Publication Data

US 2023/0317636 A1 Oct. 5, 2023

(30) Foreign Application Priority Data

Mar. 29, 2022 (KR) ........................ 10-2022-0038962

(51) Int. Cl.
*H01L 23/00* (2006.01)
*H01L 23/58* (2006.01)
(Continued)

(52) U.S. Cl.
CPC ............ *H10W 42/00* (2026.01); *H10B 43/27* (2023.02)

(58) Field of Classification Search
CPC ........ H10B 41/27; H10B 43/27; H10B 43/40; H10B 43/50; H10B 43/10; H10B 43/35; H10B 41/10; H10B 41/35; H10B 41/50; H10B 41/40; H10B 41/41; H10B 43/30; H10B 80/00; H10B 12/01; H10B 41/30; H10W 20/42; H10W 20/435;
(Continued)

(56) References Cited

U.S. PATENT DOCUMENTS

| | | | | |
|---|---|---|---|---|
| 9,620,460 B2 * | 4/2017 | Noh | | H01L 23/585 |
| 10,665,607 B1 * | 5/2020 | Sugiura | | H10B 43/10 |

(Continued)

FOREIGN PATENT DOCUMENTS

| | | | |
|---|---|---|---|
| CN | 109727981 A | 5/2019 | |
| CN | 111081640 A * | 4/2020 | H10P 54/00 |

(Continued)

OTHER PUBLICATIONS

Translation for CN 111081640 A (Year: 2020).*

*Primary Examiner* — Leonard Chang
*Assistant Examiner* — Tsz K Chiu
(74) *Attorney, Agent, or Firm* — WILLIAM PARK AND ASSOCIATES LTD.

(57) ABSTRACT

There are provided a semiconductor memory device and a manufacturing method thereof. The semiconductor memory device includes: a lower structure in which a cell region and a chip guard region are defined, wherein the cell region and the chip guard region are divided along a first direction; a first lower stack structure formed on the lower structure in the chip guard region, the first lower stack structure including a plurality of first lower material layers, the first lower stack structure including a first etch stop layer formed along an edge thereof; a first upper stack structure formed on the first lower stack structure in the chip guard region, the first upper stack structure including a plurality of first upper material layers; and a first slit penetrating the first upper stack structure to expose the first etch stop layer in the chip guard region.

13 Claims, 21 Drawing Sheets

(51) Int. Cl.
*H10B 43/27* (2023.01)
*H10W 42/00* (2026.01)

(58) Field of Classification Search
CPC . H10W 20/4403; H10W 20/47; H10W 42/00; H10W 74/147; H10W 76/60
See application file for complete search history.

(56) References Cited

U.S. PATENT DOCUMENTS

| | | | | |
|---|---|---|---|---|
| 2011/0127666 | A1 | 6/2011 | Tsai et al. | |
| 2013/0161818 | A1 | 6/2013 | Han | |
| 2017/0309636 | A1 | 10/2017 | Lee | |
| 2021/0313240 | A1 | 10/2021 | Tanamachi et al. | |
| 2021/0313281 | A1* | 10/2021 | Kaminaga | H10B 43/10 |
| 2022/0045093 | A1* | 2/2022 | Lee | H10B 43/35 |
| 2022/0068853 | A1* | 3/2022 | Lee | H01L 24/02 |

FOREIGN PATENT DOCUMENTS

| | | | |
|---|---|---|---|
| CN | 113990873 | A | 1/2022 |
| KR | 102199128 | B1 | 1/2021 |

* cited by examiner

SEMICONDUCTOR MEMORY DEVICE WITH GUARD REGION STACK STRUCTURE AND FABRICATION METHOD

CROSS-REFERENCE TO RELATED APPLICATION

The present application claims priority under 35 U.S.C. § 119(a) to Korean patent application number 10-2022-0038962, filed on Mar. 29, 2022, in the Korean Intellectual Property Office, the entire disclosure of which is incorporated herein by reference.

BACKGROUND

1. Technical Field

The present disclosure generally relates to a semiconductor memory device and a manufacturing method thereof, and more particularly, to a semiconductor memory device including an etch stop layer in a chip guard region and a manufacturing method of the semiconductor memory device.

2. Related Art

A semiconductor memory device may include a volatile memory device in which stored data disappears when the supply of power is interrupted and a nonvolatile memory device in which stored data is retained even when the supply of power is interrupted.

Among these, the nonvolatile memory device further requires a large capacity and a high degree of integration as the use of portable electronic devices, such as mobile phones and notebook computers, increase.

Accordingly, as the improvement of the degree of integration of two-dimensional nonvolatile memory devices in which memory cells are formed in the form of a single layer over a substrate reaches its limit, there has recently been proposed a three-dimensional nonvolatile memory device in which memory cells are stacked vertically over a substrate.

SUMMARY

In accordance with an aspect of the present disclosure, there is provided a semiconductor memory device including: a lower structure in which a cell region and a chip guard region are defined, wherein the cell region and the chip guard region are divided along a first direction; a first lower stack structure formed on the lower structure in the chip guard region, the first lower stack structure including a plurality of first lower material layers, the first lower stack structure including a first etch stop layer formed along an edge thereof; a first upper stack structure formed on the first lower stack structure in the chip guard region, the first upper stack structure including a plurality of first upper material layers; and a first slit penetrating the first upper stack structure to expose the first etch stop layer in the chip guard region.

In accordance with another aspect of the present disclosure, there is provided a method of manufacturing a semiconductor memory device, the method including: forming a first lower stack structure on a lower structure in which a cell region and a chip guard region are defined, the first lower stack structure including first lower insulating layers and first lower material layers that are alternately stacked, and includes a first etch stop layer formed along an edge thereof; forming a first upper stack structure on the first lower stack structure, the first upper stack structure including first upper insulating layers and first upper material layers that are alternately stacked; and exposing the first etch stop layer by forming a first slit that penetrates the first upper stack structure in the chip guard region.

In accordance with still another aspect of the present disclosure, there is provided a method of manufacturing a semiconductor memory device, the method including: forming a lower stack structure on a lower structure in which a cell region and a chip guard region are defined, wherein the lower stack structure includes a first etch stop layer and a second etch stop layer formed along edges thereof; forming an upper stack structure on the lower stack structure; and exposing the first etch stop layer that is included in the lower stack structure by forming a first slit that penetrates the upper stack structure in the chip guard region, and exposing the second etch stop layer that is included in the lower stack structure by forming a second slit that penetrates the upper stack structure in the cell region.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor memory device and a manufacturing method thereof, in which abnormal oxidation of lines disposed at a lower portion of a chip guard region is prevented, so that the reliability of the semiconductor memory device can be improved.

Figure 1:
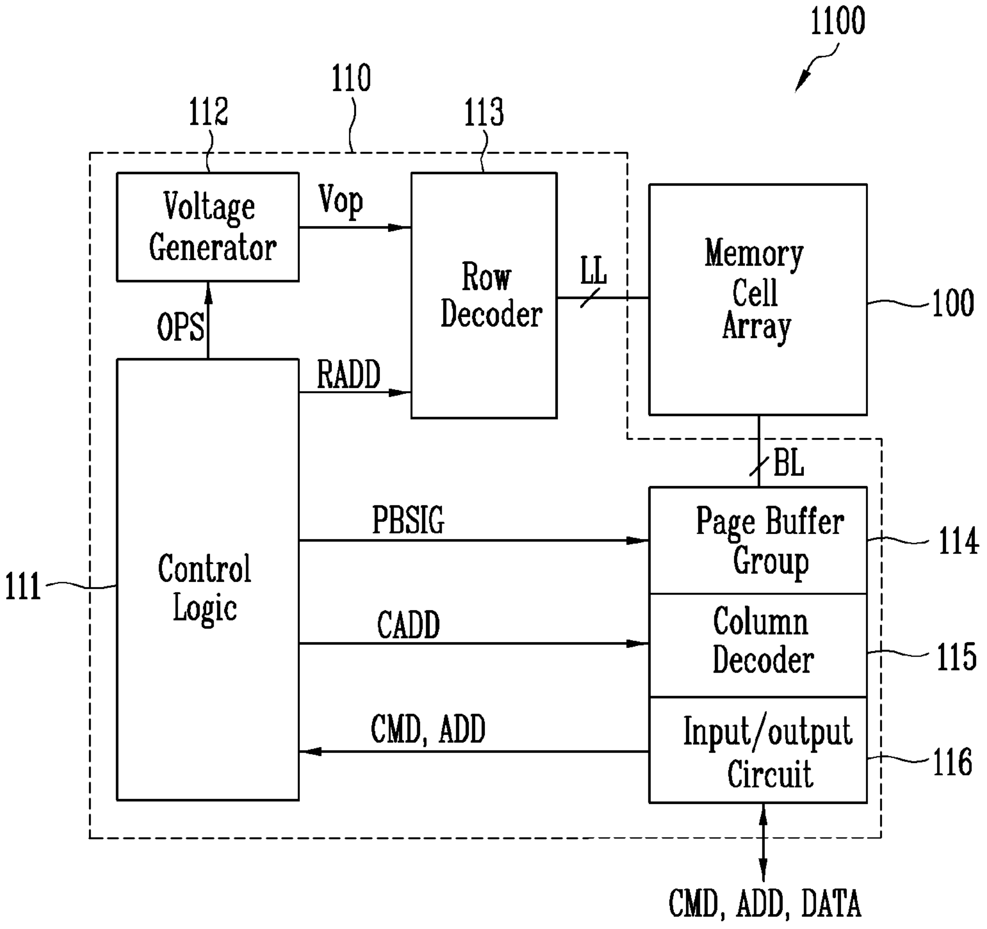
FIG. 1 is a diagram illustrating a semiconductor memory device in accordance with an embodiment of the present disclosure.

FIG. 1 is a diagram illustrating a semiconductor memory device in accordance with an embodiment of the present disclosure.

Referring to FIG. 1, the semiconductor memory device 1100 may include a memory cell array 100 capable of storing data and peripheral circuits 110 capable of performing a program, read, or erase operation.

The memory cell array 100 may include a plurality of memory blocks including nonvolatile memory cells. Local lines LL may be connected to each of the memory blocks, and bit lines may be commonly connected to the memory blocks.

The peripheral circuits 110 may include a control logic 111, a voltage generator 112, a row decoder 113, a page buffer group 114, a column decoder 115, and an input/output circuit 116.

The control logic 111 may control the voltage generator 112, the row decoder 113, the page buffer group 114, the column decoder 115, and the input/output circuit 116 according to a command CMD and an address ADD. For example, the control logic 111 may output an operation signal OPS and a page buffer control signal PBSIG in response to the command CMD and may output a row address RADD and a column address CADD in response to the address ADD.

The voltage generator 112 may generate and output operating voltages Vop that are necessary for a program, read or erase operation in response to the operation signal OPS. For example, the voltage generator 112 may generate and output the operating voltages Vop including a program voltage, a read voltage, an erase voltage, a pass voltage, and the like.

The row decoder 113 may transfer the operating voltages Vop to a selected memory block through the local lines LL in response to the row address RADD.

The page buffer group 114 may include a plurality of page buffers that are connected to the bit lines BL. The page buffer group 114 may temporarily store data in a program or read operation in response to the page buffer control signal PBSIG.

The column decoder 115 may transmit data between the page buffer group 114 and the input/output circuit 116 in response to the column address CADD.

The input/output circuit 116 may receive a command CMD and an address ADD from an external device and may transmit the command CMD and the address ADD to the control logic 111. The input/output circuit 116 may transmit data DATA that is received from the external device to the column decoder 115 in a program operation and may output data DATA that is received from the column decoder 115 to the external device in a read operation.

Figure 2:
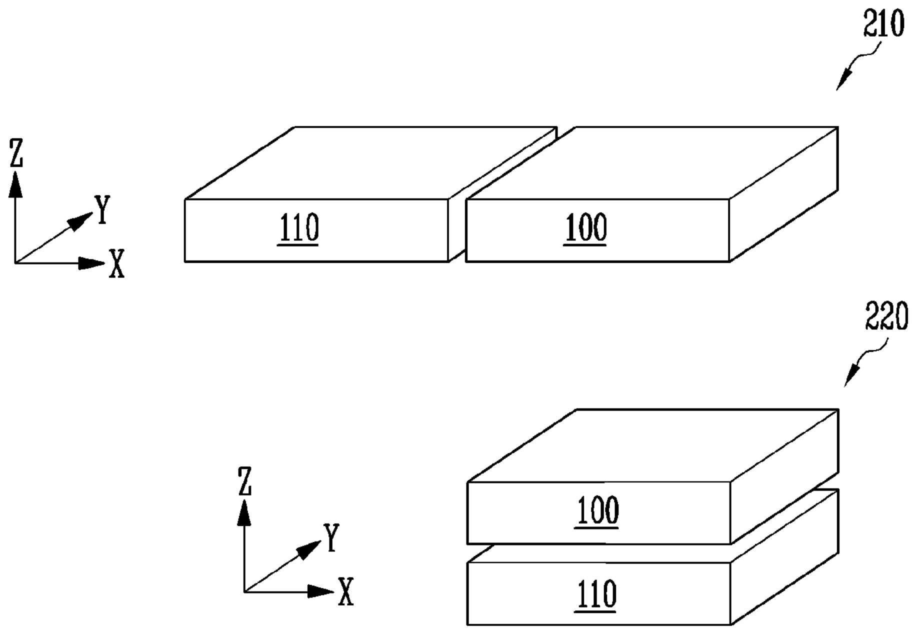
FIG. 2 is a diagram illustrating an arrangement between a memory cell array and peripheral circuits.

FIG. 2 is a diagram illustrating an arrangement between a memory cell array and peripheral circuits.

Referring to FIG. 2, the memory cell array 100 and the peripheral circuit 110, which are described above in FIG. 1, may be arranged in various structures. For example, when a substrate is disposed in parallel to an X-Y direction, the memory cell array 100 and the peripheral circuits 110 may be arranged in parallel to the X-Y direction (210). Alternatively, the memory cell array 100 may be disposed above the peripheral circuits 110 in a direction (Z direction), vertical to the substrate (220). That is, the peripheral circuits 110 may be disposed between the substrate and the memory cell array 100.

Figure 3:
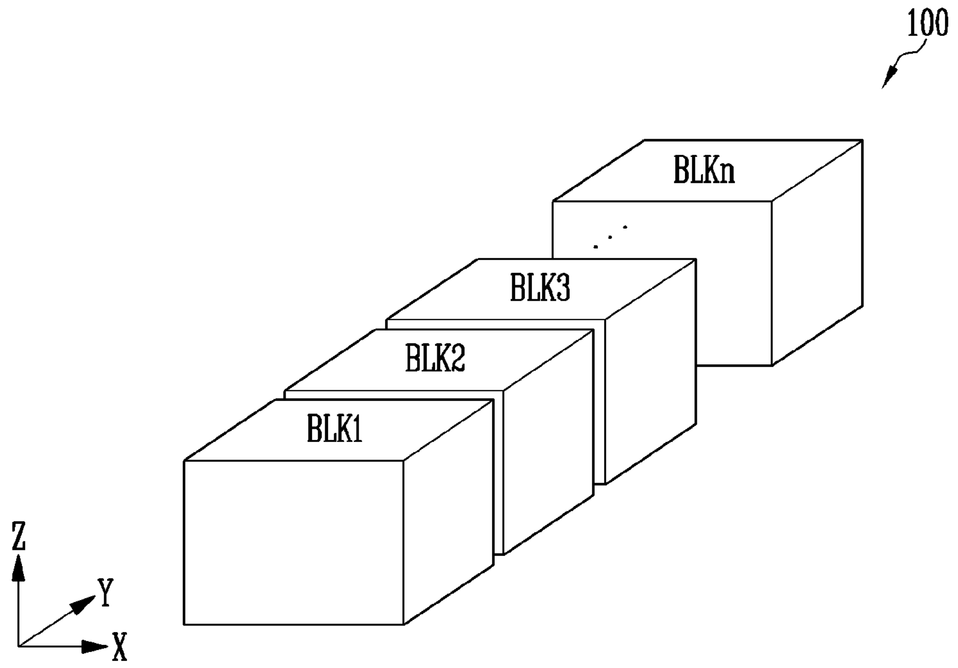
FIG. 3 is a diagram illustrating a memory cells array including memory blocks formed in a three-dimensional structure.

FIG. 3 is a diagram illustrating a memory cells array including memory blocks formed in a three-dimensional structure.

Referring to FIG. 3, when the memory cell array 100 includes memory blocks BLK1 to BLKn that are formed in a three-dimensional structure, the memory blocks BLK1 to BLKn may be arranged in a Y direction. The Y direction may be a direction in which the bit lines BL shown in FIG. 1 extend.

The memory cell array 100 shown in FIG. 3 includes one plane, but may include a plurality of planes. The plurality of planes may be arranged in an X direction, and memory blocks that are included in each plane may be arranged in the Y direction in the corresponding plane.

Figure 4:
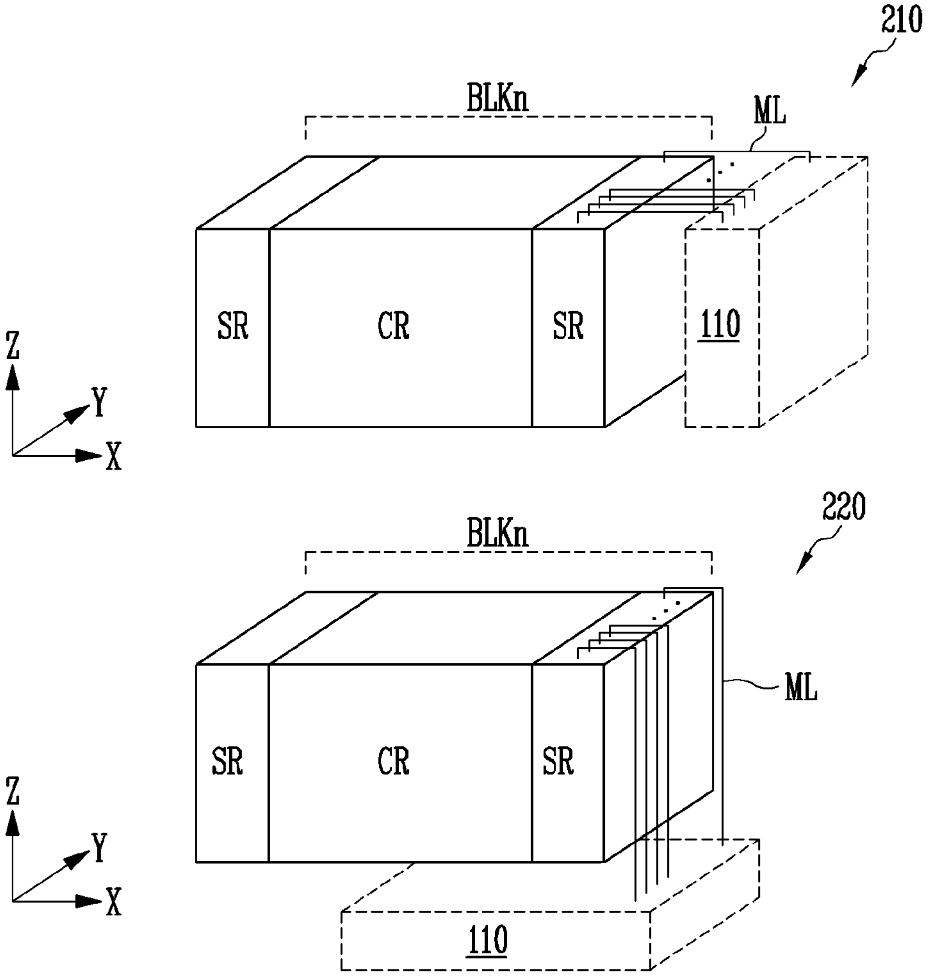
FIG. 4 is a diagram illustrating a configuration of a memory block and a connection relationship between the memory block and peripheral circuits.

FIG. 4 is a diagram illustrating a configuration of a memory block and a connection relationship between the memory block and peripheral circuits.

In FIG. 3, the above-described plurality of memory blocks BLK1 to BLKn may be configured identically to one another. In FIG. 4, any one memory block BLKn, among the plurality of memory blocks BLK1 to BLKn, is illustrated as an embodiment.

Referring to FIG. 4, the memory block BLKn that is formed in a three-dimensional structure may include a cell region CR in which memory cells are included and a slimming region SR for electrically connecting the peripheral circuits 110 and the cell region CR to each other. For example, vertical strings in which memory cells and select transistors are stacked may be included in the cell region CR, and ends of a plurality of gate lines connected to the memory cells and the select transistors may be included in the slimming region SR. For example, in the slimming region SR, the gate lines may be stacked in a stepped structure and may be formed in a stepped structure in which a gate line that is located at a relatively low portion extends longer than a gate line that is located at an upper portion. Gate lines that are exposed by the stepped structure may be connected to the peripheral circuits 110 through contact plugs.

When the peripheral circuits 110 are disposed in a direction (X direction), horizontal to the memory block BLKn (210), a plurality of lines ML for electrically connecting the slimming region SR and the peripheral circuits 110 to each other may be formed. For example, in the structure 210, the plurality of lines ML may be disposed to extend along the X direction and to be spaced apart from each other along the Y direction.

When the peripheral circuits 110 is disposed under the memory block BLKn (220) in relation to the Z direction, a plurality of lines ML for electrically connecting the slimming region SR and the peripheral circuits 110 to each other may be disposed to extend along the Z direction and to be spaced apart from each other along the Y direction.

Figure 5:
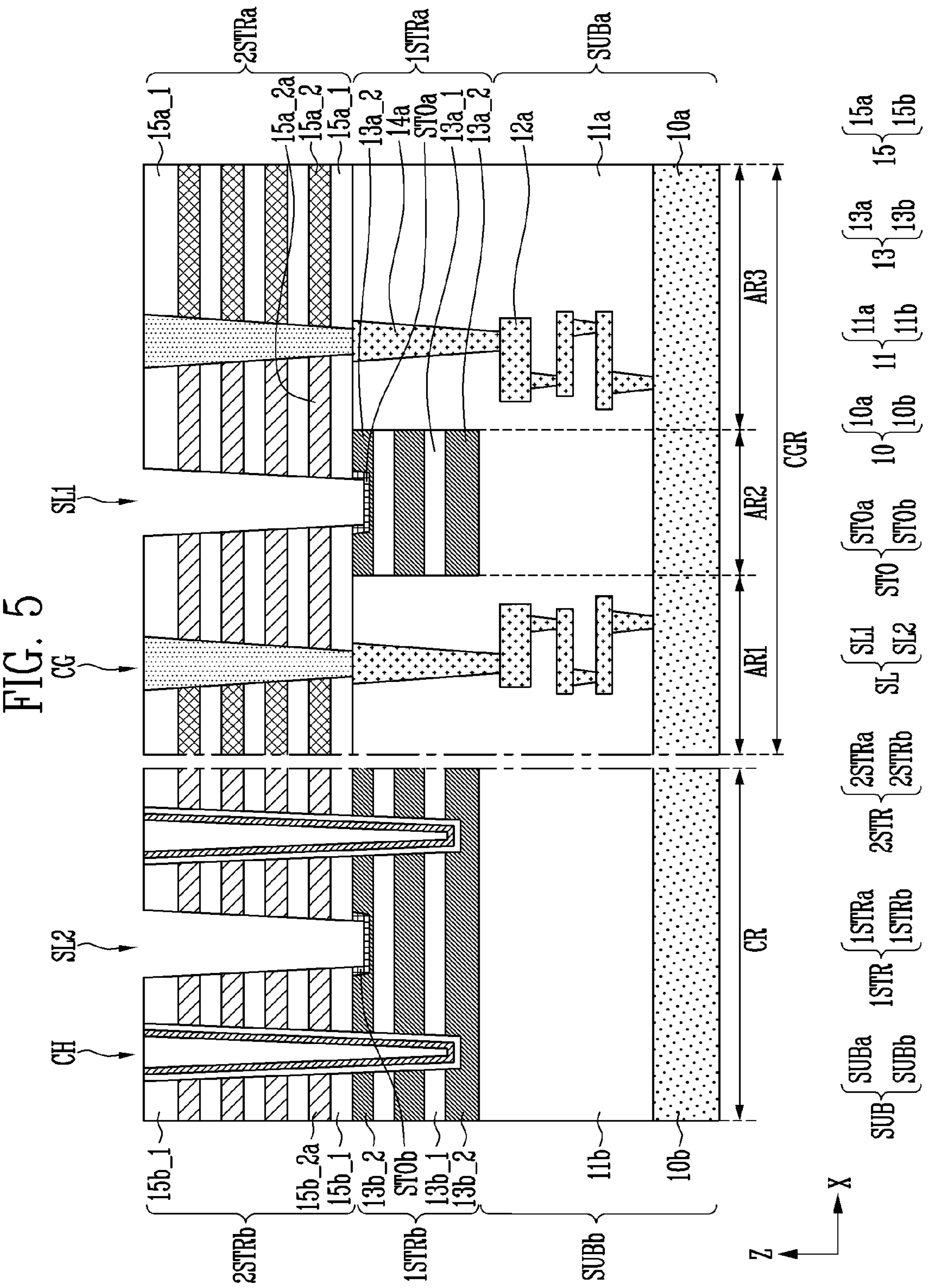
FIG. 5 is a view illustrating a structure of a semiconductor memory device in accordance with an embodiment of the present disclosure.

FIG. 5 is a view illustrating a structure of a semiconductor memory device in accordance with an embodiment of the present disclosure.

Referring to FIG. 5, the semiconductor memory device in accordance with the embodiment of the present disclosure may include a cell region CR and a chip guard region CGR. The chip guard region CGR may be a region in which a chip guard for protecting a memory chip is formed and may be defined as a region that surrounds the periphery of the cell region CR. In some embodiments, the cell region CR and the chip guard region CGR may be divided along a first direction (e.g., the X direction), and the chip guard region CGR may include a first region AR1, a second region AR2, and a third region AR3, which are defined along one direction (e.g., the X direction).

A stack structure in which a lower stack structure 1STR and an upper stack structure 2STR are sequentially stacked may be formed on a lower structure in which the cell region CR and the chip guard region CGR are defined. The lower structure SUB may be, for example, a semiconductor substrate or may include a structure that corresponds to peripheral circuits that are formed on the semiconductor substrate. The lower structure SUB may include a first lower structure SUBa in which the chip guard region CGR is defined and a second lower structure SUBb in which the cell region CR is defined.

The first lower structure SUBa may include a first substrate 10*a*, at least one first insulating layer 11*a* that is formed on the first substrate 10*a*, and a plurality of lower connection structures 12*a* that are formed in the first insulating layer 11*a*. The first substrate 10*a* may be a substrate including a semiconductor material. The semiconductor material may be, for example, a material containing silicon.

The first insulating layer 11*a* may be formed on the first substrate 10*a* in, for example, the first region AR1 and the third region AR3. The first Insulating layer 11*a* may include a plurality of stacked insulating layers (not shown). The first insulating layer 11*a* may be formed of silicon oxide containing a small amount of impurities or no impurities. The first insulating layer 11*a* may be formed of, for example, at least one material that is selected from boron silicate glass (BSG), phosphorous silicate glass (PSG), boron phosphorous silicate glass (BPSG), silicon oxy fluoride (SIOF), silicon carbonic hydro oxide (SICHO), tetra ethyl ortho silicate (TEOS), and undoped silicate glass (USG). The first insulating layer 11*a* may be formed through various deposition processes including a chemical deposition process that uses heat or plasma or a spin coating process.

The plurality of lower connection structures 12*a* may be formed in the first insulating layer 11*a* in, for example, the first region AR1 and the third region AR3. Also, the plurality of lower connection structures 12*a* may be formed of, for example, a material containing tungsten W. The plurality of lower connection structures 12*a* may be formed on the first substrate 10*a* to be connected to a plurality of upper connection structures 14*a*, which will be described later.

The second lower structure SUBb may include a second substrate 10*b*, at least one second insulating layer 11*b* that is formed on the second substrate 10*b*, and a plurality of connection structures (not shown) that is formed in the second insulating layer 11*b*. The second substrate 10*b* may be identical to the first substrate 10*a*. The second substrate 10*b* may be, for example, a substrate including the same semiconductor material as the first substrate 10*a*. The semiconductor material may be, for example, a material containing silicon.

The second insulating layer 11*b* may be formed on the second substrate 10*b*. The second insulating layer 11*b* may be identical to the first insulating layer 11*a*. The second insulating layer 11*b* may include, for example, a plurality of stacked insulating layers (not shown). The second insulating layer 11*b* may be formed of silicon oxide containing a small amount of impurities or no impurities. The second insulating layer 11*b* may be formed of, for example, at least one material that is selected from boron silicate glass (BSG), phosphorous silicate glass (PSG), boron phosphorous silicate glass (BPSG), silicon oxy fluoride (SiOF), silicon carbonic hydro oxide (SiCHO), tetra ethyl ortho silicate (TEOS), and undoped silicate glass (USG). The second insulating layer 11*b* may be formed through various deposition processes including a chemical deposition process that uses heat or plasma or a spin coating process.

Although not shown in the drawing, the plurality of connection structures (not shown) in the second insulating layer 11*b* may be formed on the second substrate 10*b*. Unlike the plurality of lower connection structures 12*a* of the chip guard region CGR, the plurality of connection structures of the cell region CR might not be connected to materials of a second lower stack structure 1STRb that is formed on the second insulating layer 11*b*.

The lower stack structure 1STR may include a first lower stack structure 1STRa that is formed on the first lower structure SUBa in which the chip guard region CGR is defined and the second lower stack structure 1STRb that is formed on the second lower structure SUBb in which the cell region CR is defined.

The first lower stack structure 1STRa may include first lower insulating layers 13*a*_1 and first lower material layers 13*a*_2, which are alternately stacked in the Z-direction on the first lower structure SUBa, and may include a first etch stop layer STOa that is formed along an edge of the first lower stack structure 1STRa. In some embodiments, the edge of the first lower stack structure 1STRa may be a top edge which is an uppermost end that is located at the highest position of the first lower stack structure 1STRa. For example, a first lower material layer 13*a*_2 may be formed at the top edge of the first lower stack structure 1STRa, and the first etch stop layer STOa may be formed in the first lower material layer 13*a*_2 at the top edge.

The first lower material layers 13*a*_2 may be formed of a material having a high etch selectivity with respect to the first lower insulating layers 13*a*_1. The first lower insulating layers 13*a*_1 may be, for example, insulating layers including oxide and the like.

The first lower stack structures 1STRa may include, for example, at least three first lower material layers 13*a*_2. A lowermost first lower material layer 13*a*_2 and an uppermost first lower material layer 13*a*_2 may be doped silicon layers, and the middle first lower material layer 13*a*_2 may be an undoped silicon layer. The middle first lower material layer 13*a*_2 may be a sacrificial layer. The sacrificial layer may be removed in a subsequent source line forming process, and the emptied space from the removal of the sacrificial layer may be refilled with a doped silicon layer.

The first lower stack structure 1STRa may be formed in, for example, only the second region AR2. The first lower material layers 13*a*_2 may be identical to the first lower insulating layers 13*a*_1 in the second region AR2. For example, the first lower material layers 13*a*_2 and the first lower insulating layers 13*a*_1 may be insulating layers including oxide and the like.

In the second region AR2, the first lower stack structure 1STRa may include the plurality of upper connection structures 14*a* penetrating the first lower insulating layers 13*a*_1 and the first lower material layers 13*a*_2. The plurality of upper connection structures 14*a* may be respectively connected to the plurality of lower connection structures 12*a*. Also, the plurality of upper connection structures 14*a* may be respectively connected to a plurality of chip guards CG, which will be described later. The plurality of upper connection structures 14*a* may be formed of, for example, the same material as the plurality of lower connection structures 12*a*. The plurality of upper connection structures 14*a* may be formed of, for example, a material containing tungsten (W).

The first etch stop layer STOa may be formed, for example, in the first lower material layer 13*a*_2 that is located at the top edge of the first lower stack structure 1STRa in the second region AR2, which is located on the bottom of a first slit SL1, which will be described later. In some embodiments, the top edge of the first lower stack structure 1STRa may be the uppermost end that is located at the highest position of the first lower stack structure 1STRa. The first etch stop layer STOa may have a height equal to or lower than a height of the first lower material layer 13*a*_2 located at the top edge of the first lower stack structure 1STRa.

The first etch stop layer STOa that is located on the bottom of the first slit SL1 may prevent the etching of the first lower insulating layers 13*a*_1 or the first insulating layer 11*a*, located under the first etch stop layer STOa, while etching the first slit SL1.

The first etch stop layer STOa may be formed of a material having a high etch selectivity with respect to the first lower insulating layers 13*a*_1 or the first lower material layers 13*a*_2. The first etch stop layer STOa may be formed of a material that is harder than silicon oxide layers. The first etch stop layer STOa may be formed of a metal material. The first etch stop layer STOa may be formed of, for example, a material including tungsten.

The first etch stop layer STOa and a second etch stop layer STOb may be simultaneously formed. The first etch stop layer STOa will be described later through the same process as the second etch stop layer STOb.

The second lower stack structure 1STRb may include second lower insulating layers 13*b*_1 and second lower material layers 13*b*_2, which are alternately stacked in the Z-direction on the second lower structure, and may include the second etch stop layer STOb that is formed along an edge of the second lower stack structure 1STRb. In 1*o* some embodiments, the edge of the second lower stack structure 1STRb may be a top edge, which is an uppermost end that is located at the highest position of the second lower stack structure 1STRb. For example, a second lower material layer 13*b*_2 may be formed at the top edge of the second lower stack structure 1STRb, and the second etch stop layer STOb may be formed in the second lower material layer 13*b*_2 at the top edge.

The second lower material layers 13*b*_2 may be formed of a material having a high etch selectivity with respect to the second lower insulating layers 13*b*_1. The second lower insulating layers 13*b*_1 may be, for example, an insulating layer including oxide and the like.

The second lower stack structure 1STRb may include, for example, at least three second lower material layers 13*b*_2. A lowermost second lower material layer 13*b*_2 and an uppermost second lower material layer 13*b*_2 may be doped silicon layers, and the middle second lower material layer 13*b*_2 may be an undoped silicon layer. The middle second lower material layer 13*b*_2 may be a sacrificial layer. The sacrificial layer may be removed in a subsequent source line forming process, and the emptied space from the removal of the sacrificial layer may be refilled with a doped silicon layer.

The second etch stop layer STOb may be formed in, for example, the second lower material layer 13*b*_2 that is located at the top edge of the second lower stack structure 1STRb, which is located on the bottom of a second slit SL2, which will be described later. In some embodiments, the top edge of the second lower stack structure 1STRb may be the uppermost end that is located at the highest position of the second lower stack structure 1STRb. The second etch stop layer STOb may have a height that is equal to or lower than a height of the second lower material layer 13*b*_2 that is located at the top edge of the second lower stack structure 1STRb.

The second etch stop layer STOb that is located on the bottom of the second slit SL2 may prevent the etching of the second lower insulating layers 13*b*_1 and the second lower material layers 13*b*_2, located under the second etch stop layer STOb, while etching the second slit SL2.

The second etch stop layer STOb may be formed of a material having a high etch selectivity with respect to the second lower insulating layers 13*b*_1 or the second lower material layers 13*b*_2. The second etch stop layer STOb may be formed of a material that is harder than silicon oxide layers. The second etch stop layer STOb may be formed of a metal material. The second etch stop layer STOb may be formed of, for example, a material including tungsten.

The second etch stop layer STOb and the first etch stop layer STOa may be simultaneously formed through the same process as the first etch stop layer STOa.

The upper stack structure 2STR may include a first upper stack structure 2STRa that is formed on the first lower stack structure 1STRa in which the chip guard region CGR is defined and a second upper stack structure 2STRb that is formed on the second lower stack structure 1STRb in which the cell region CR is defined.

The first upper stack structure 2STRa may include first upper insulating layers 15*a*_1 and first upper material layers 15*a*_2, which are alternately stacked on the first lower stack structure 1STRa. For example, a first upper insulating layer 15*a*_1 may be formed at an uppermost end of the first upper stack structure 2STRa. In some embodiments, the first upper stack structure 2STRa may include first upper insulating layers 15*a*_1 and first conductive layers 15*a*_2*a*, which are alternately stacked on the first lower stack structure 1STRa. The first conductive layers 15*a*_2*a* may be formed, for example, between the chip guard CG, which will be described later, and the first slit SL1. The first conductive layers 15*a*_2*a* may be, for example, conductive layers including poly-silicon, tungsten, and the like.

The first upper material layers 15*a*_2 may be formed of a material having a high etch selectivity with respect to the first upper insulating layers 15*a*_1. For example, the first upper material layers 15*a*_2 may be sacrificial layers including nitride and the like, and the first upper insulating layers 15*a*_1 may be insulating layers including oxide and the like.

In the first region AR1 and the third region AR3, the first upper stack structure 2STRa may include a plurality of chip guards CG that penetrate the first upper insulating layers 15*a*_1 and the first upper material layers 15*a*_2. The plurality of chip guards CG may be respectively formed on and connected to the plurality of upper connection structures 14*a*.

In the second region AR2, the first upper stack structure 2STRa may include the first slit SL1 that penetrates the first upper insulating layers 15*a*_1 and the first upper material layers 15*a*_2. The first slit SL1 may expose the first upper insulating layers 15*a*_1 and the first upper material layers 15*a*_2 of the first upper stack structure 2STRa and may expose the first etch stop layer STOa of the first lower stack structure 1STRa.

In the chip guard region CGR, oxidation of the plurality of upper connection structures 14*a* and the plurality of lower connection structures 12*a* may occur due to overetching of the first slit SL1. However, when the first etch stop layer STOa is formed on the bottom of the first slit SL1, the overetching of the first slit SL1 is prevented, preventing abnormal oxidation of lines (e.g., the plurality of upper connection structures 14*a* and the plurality of lower connection structures 12*a*) that are located at a lower portion of the chip guard region CGR. Thus, the reliability of the semiconductor memory device can be improved. In addition, as disclosed earlier, the first etch stop layer STOa in the chip guard region CGR and the second etch stop layer STOb in the cell region CR may be formed simultaneously and through the same process. Thus, any additional process is not necessary, so that a manufacturing process can be simplified.

The second upper stack structure 2STRb may include second upper insulating layers 15*b*_1 and second conductive layers 15*b*_2*a*. For example, a second upper insulating layer 15*b*_1 may be formed at an uppermost end of the second upper stack structure 2STRb.

The second upper insulating layers 15*b*_1 may be used to insulate stacked gate electrodes from each other, and the second conductive layers 15*b*_2*a* may be used to form gate electrodes of a memory cell, a select transistor, and the like.

The second conductive layers 15*b*_2*a* may be formed of a material having a high etch selectivity with respect to the second upper insulating layers 15*b*_1. For example, the second conductive layers 15*b*_2*a* may be sacrificial layers including nitride, and the second upper insulating layers 15*b*_1 may be insulating layers including oxide and the like. Alternatively, for example, the second conductive layers 15*b*_2*a* may be conductive layers including poly-silicon, tungsten, and the like, and the second upper insulating layers 15*b*_1 may be insulating layers including oxide and the like. The conductive layers may be used as word lines or select lines in a memory block and may be formed as layers including at least one of tungsten (W), cobalt (Co), nickel (Ni), molybdenum (Mo), silicon (Si), and poly-silicon (poly-Si).

In the cell region CR, the second upper stack structure 2STRb may include a plurality of vertical plugs CH that penetrate the second upper insulating layers 15*b*_1 and the second conductive layers 15*b*_2*a*. The plurality of vertical plugs CH may be respectively formed on and connected to the plurality of upper connection structures 14*a*. Also, in the cell region CR, the second upper stack structure 2STRb may include the second slit SL2 that penetrates the second upper insulating layers 15*b*_1 and the second conductive layers 15*b*_2*a*. The second slit SL2 may expose the second upper insulating layers 15*b*_1 and the second conductive layers 15*b*_2*a* of the second upper stack structure 2STRb and may expose the second etch stop layer STOb of the second lower stack structure 1STRb.

FIGS. 6 to 21 are views illustrating a manufacturing method of the semiconductor memory device in accordance with an embodiment of the present disclosure.

Figure 6:
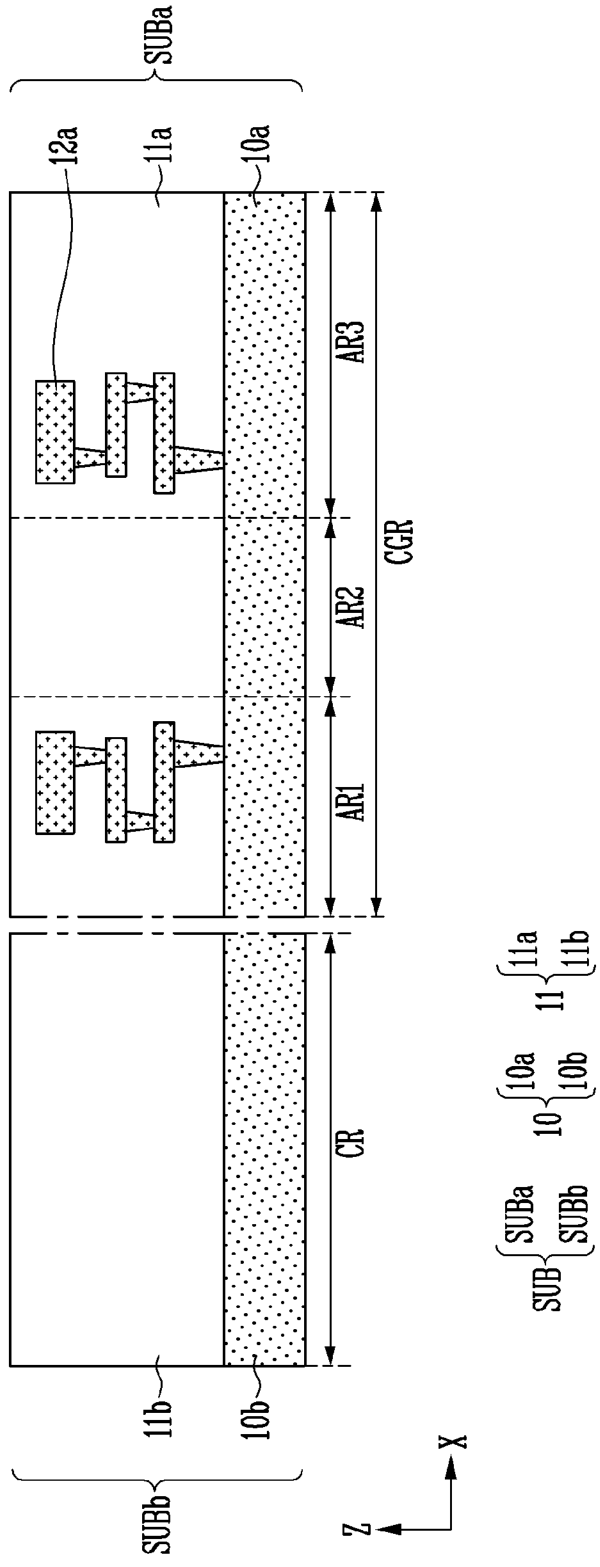
FIGS. 6 to 21 are views illustrating a manufacturing method of the semiconductor memory device in accordance with an embodiment of the present disclosure.

Referring to FIG. 6, a lower structure SUB may be formed, in which a cell region CR and a chip guard region CGR, which are divided along a first direction (e.g., the X direction), may be defined. The chip guard region CGR may include a first region AR1, a second region AR2, and a third region AR3, which are defined along one direction (e.g., the X direction). In the first region AR1 and the third region AR3, a plurality of lower connection structures 12*a* may be formed on a first substrate 10*a* in a first lower structure SUBa, and a portion of the first lower structure SUBa, except the first substrate 10*a* and the plurality of lower connection structures 12*a*, may be formed with a first insulating layer 11*a*. In addition, in the cell region CR, a second insulating layer 11*b* may be formed on a second substrate 10*b* in a second lower structure SUBb. The first insulating layer 11*a* and the second insulating layer 11*b* may be formed through the same process.

Figure 7:
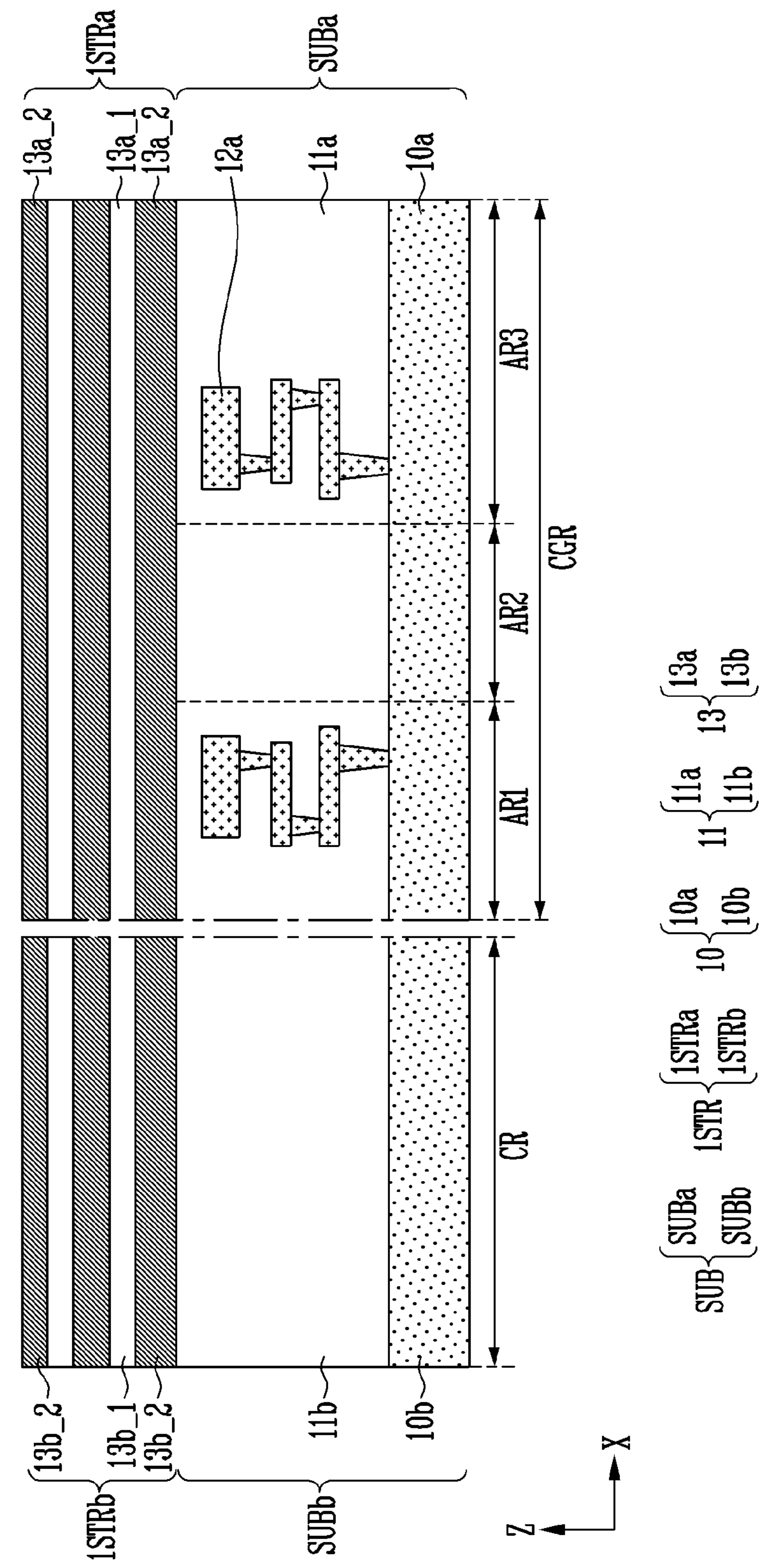

Referring to FIG. 7, a lower stack structure 1STR may be formed on the lower structure SUB. The lower stack structure 1STR may include lower insulating layers 13_1 and lower material layers 13_2.

The lower material layers 132 may be used to form gate electrodes of a memory cell, a select transistor, and the like, and the lower insulating layers 13_1 may be used to insulate gate electrodes (formed in a subsequent process) from each other. The lower material layers 13_2 may be formed of a material having a high etch selectivity with respect to the lower insulating layers 13_1. The lower insulating layers 13_1 may be, for example, insulating layers including oxide and the like. The lower stack structure 1STR may include, for example, at least three lower material layers 13_2. A lowermost lower material layer 13_2 and an uppermost lower material layer 132 may be doped silicon layers, and a middle lower material layer 13_2 may be an undoped silicon layer. The middle lower material layer 13_2 may be a sacrificial layer. The sacrificial layer may be removed in a subsequent source line forming process, and the emptied space from the removal of the sacrificial layer may be refilled with a doped silicon layer.

For example, a lower material layer 13_2 may be formed at an uppermost end of the lower stack structure 1STR.

Figure 8:
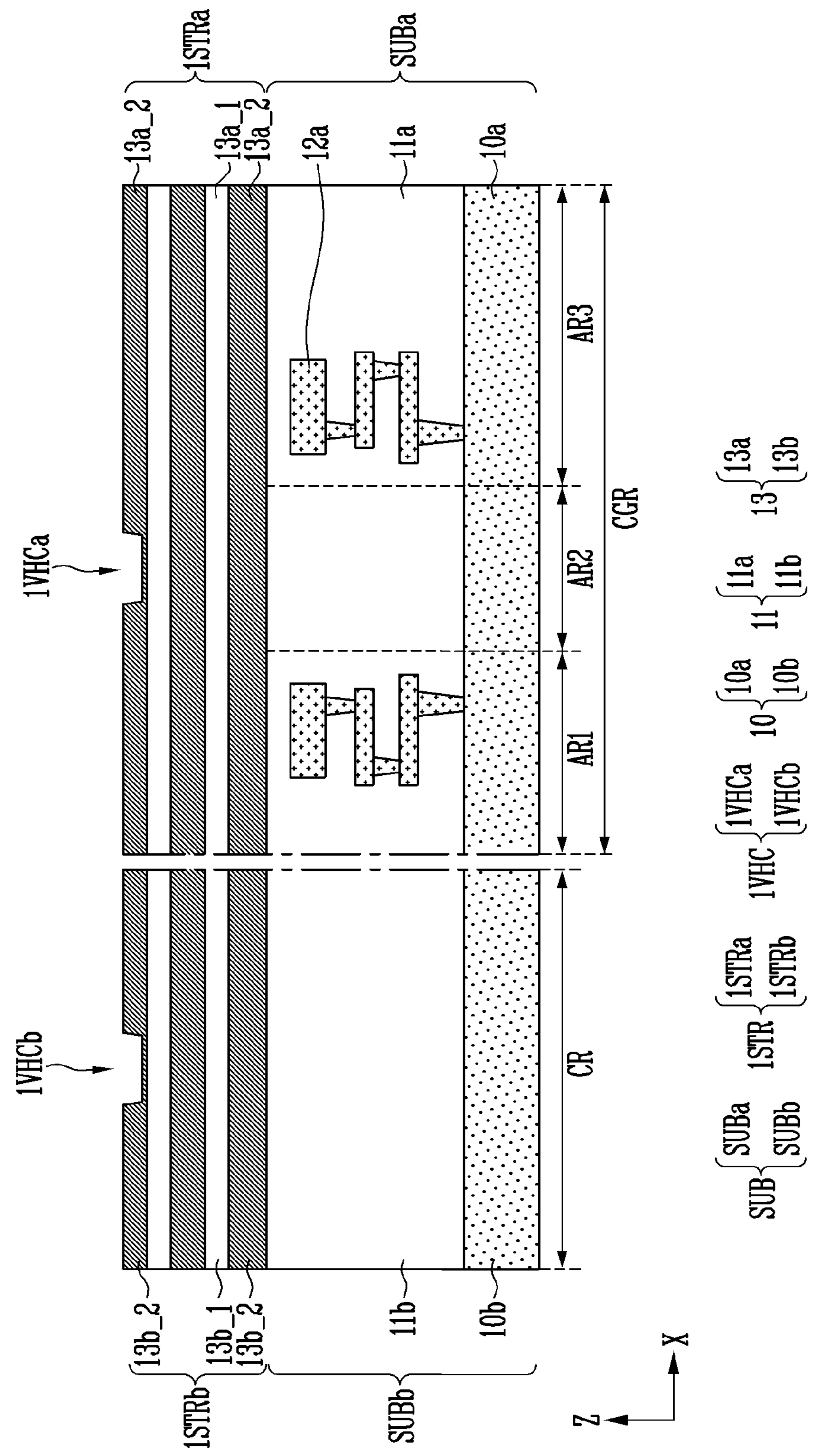

Referring to FIG. 8, a trench 1VHC may be formed at a top edge of the lower stack structure 1STR. In some embodiments, the top edge of the lower stack structure 1STR may be the uppermost end that is located at the highest position of the lower stack structure 1STR. For example, the trench 1VHC may be formed by etching a portion of the lower material layer 132 that is located at the uppermost end of the lower stack structure 1STR. The trench 1VHC may be formed through a process of forming a mask pattern (not shown) in which an opening is formed on the top of the lower material layer 132 that is formed at the uppermost end of the lower stack structure 1STR and etching the lower stack structure 1STR that is exposed through the opening. The etching process may be performed until the lower material layer 13_2 that is located at the uppermost end or a lower insulating layer 13_1 that is located just below the lower material layer 13_2 that is located at the uppermost end is exposed. Accordingly, the trench 1VHC may be formed to have a height that is equal to or smaller than a height of the lower material layer 13_2 that is located at the uppermost end of the lower stack structure 1STR. Also, the trench 1VHC may include a first trench 1VHCa that is formed in the chip guard region CGR and a second trench 1VHCb that is formed in the cell region CR, and the first trench 1VHCa may be formed in the second region AR2. The first trench 1VHCa and the second trench 1VHCb may be formed through the same process. The first trench 1VHCa that is formed in the chip guard region CGR may be formed to form a first etch stop layer STOa, and the second trench VHCb that is formed in the cell region CR may be formed to form a second etch stop layer STOb.

Figure 9:
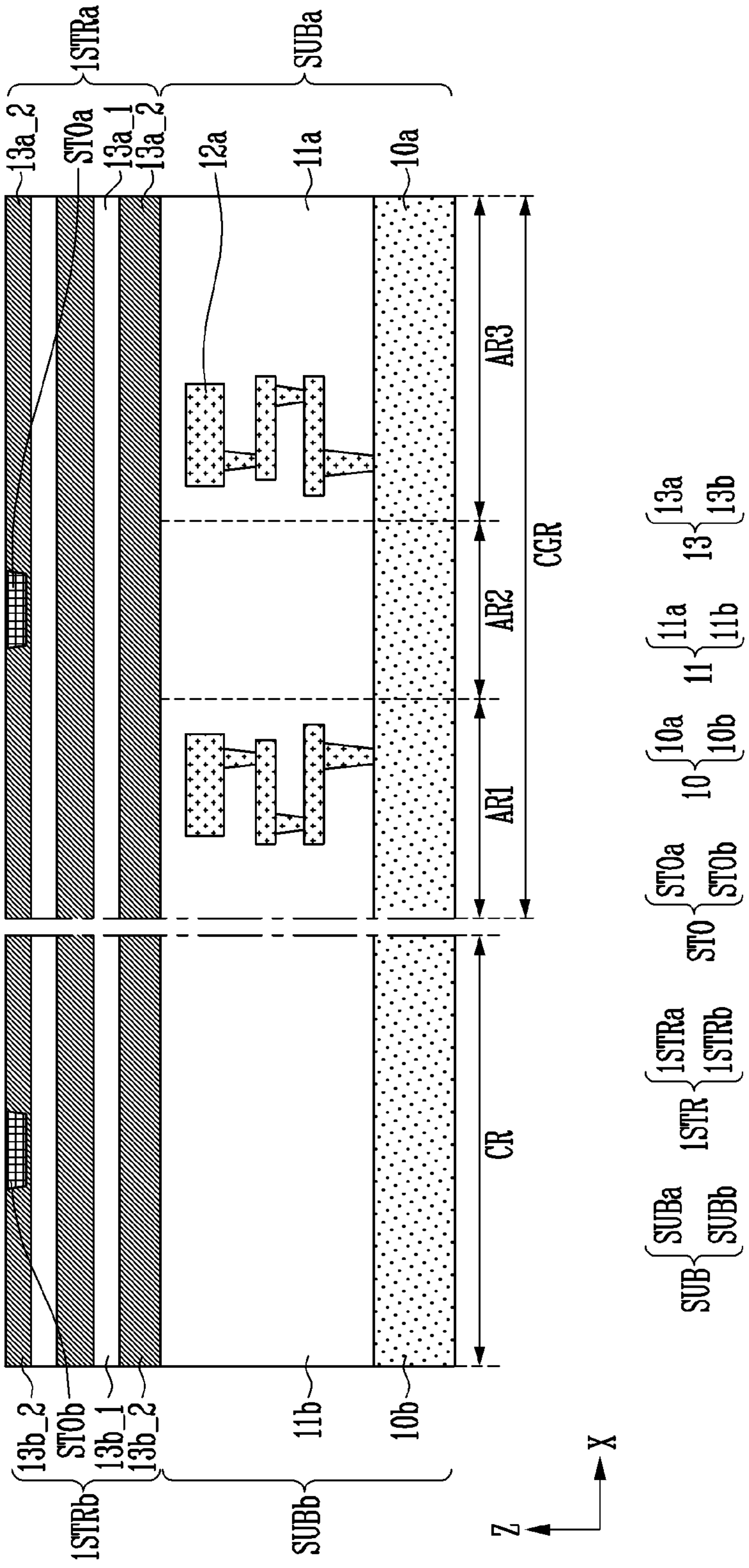

Referring to FIG. 9, an etch stop layer STO may be formed by filling the trench 1VHC with a sacrificial layer. Since the sacrificial layer is to be removed faster than the lower insulating layers 13_1 and the lower material layers 13_2 in a subsequent etching process, the sacrificial layer may be formed of a material having a high etch selectivity with respect to the lower insulating layers 13_1 and the lower material layers 13_2. The sacrificial layer may be formed of a metal material. The sacrificial layer may be formed of, for example, a material including tungsten. The first etch stop layer STOa and the second etch stop layer STOb may be simultaneously formed through the same process.

Figure 10:
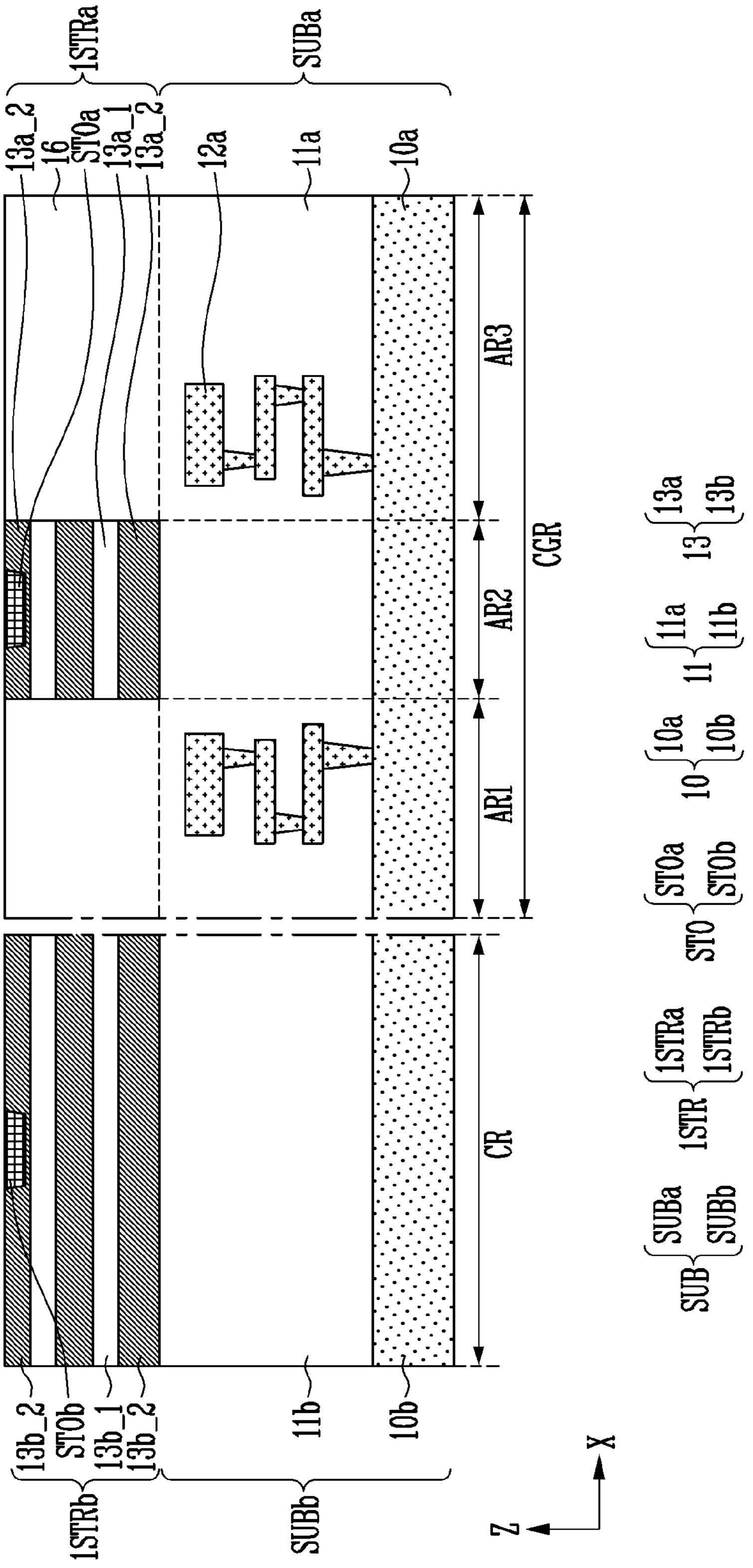

Referring to FIG. 10, a first lower stack structure 1STRa may be etched in the first region AR1 and the third region AR3 and may be filled with an insulating material 16. The insulating material 16 may be formed of the same material as first lower insulating layers 13*a*_1. For example, the insulating material 16 may include nitride and the like.

Figure 11:
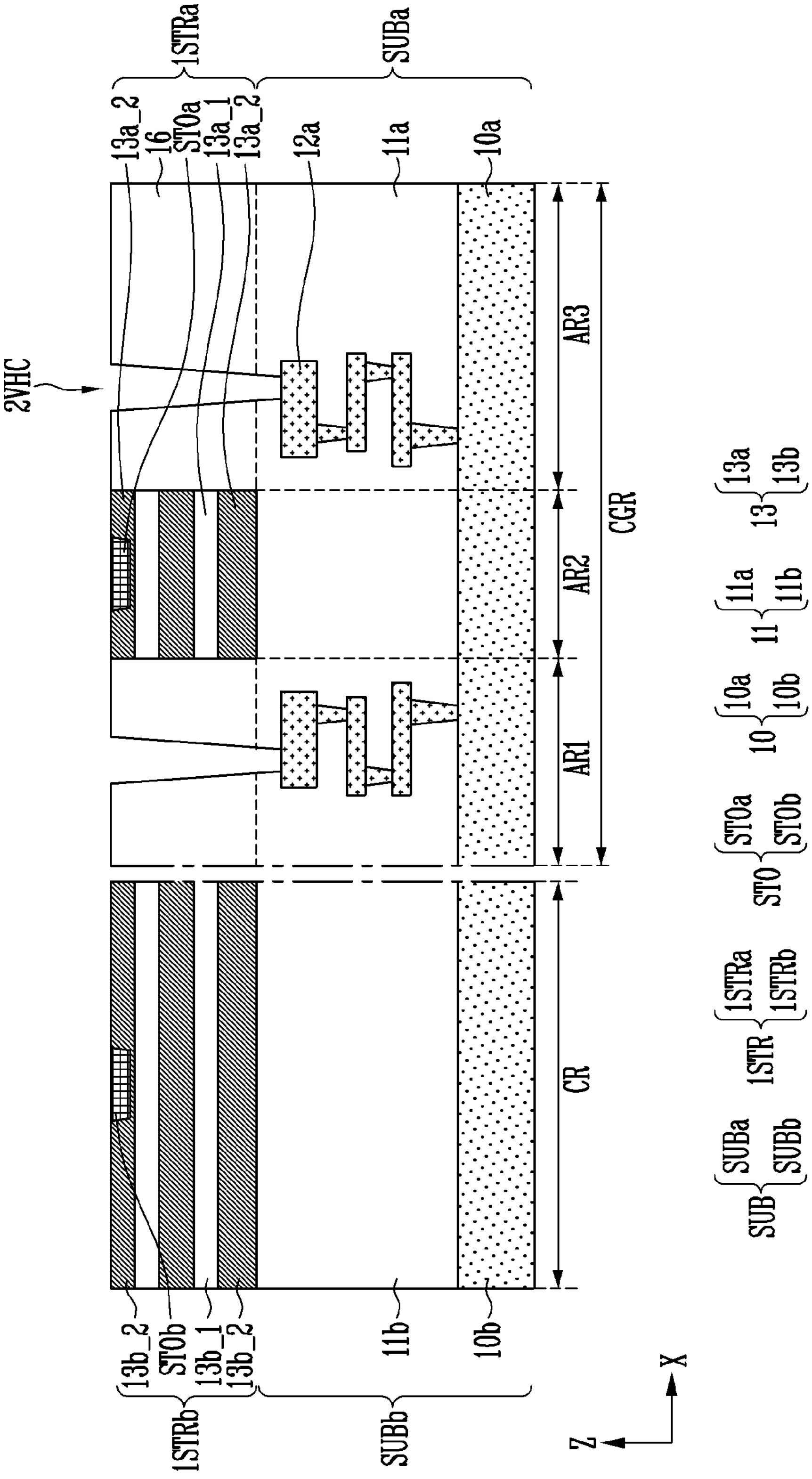

Referring to FIG. 11, a plurality of first vertical holes 2VHC may be formed, which penetrate the insulating material 16 that is formed in the first region AR1 and the third region AR3 in a vertical direction (e.g., the Z direction). For example, the plurality of first vertical holes 2VHC may be formed by etching a portion of the insulating material 16 that is formed in the first region AR1 and the third region AR3 of the first lower stack structure 1STRa. The first vertical hole 2VHC may be formed through a process of forming a mask pattern (not shown) in which an opening is formed on the top of the first lower stack structure 1STRa and etching the first lower stack structure 1STRa that is exposed through the opening. The etching process may be performed until the lower connection structure 12*a* that is located in the first lower structure SUBa is exposed.

Figure 12:
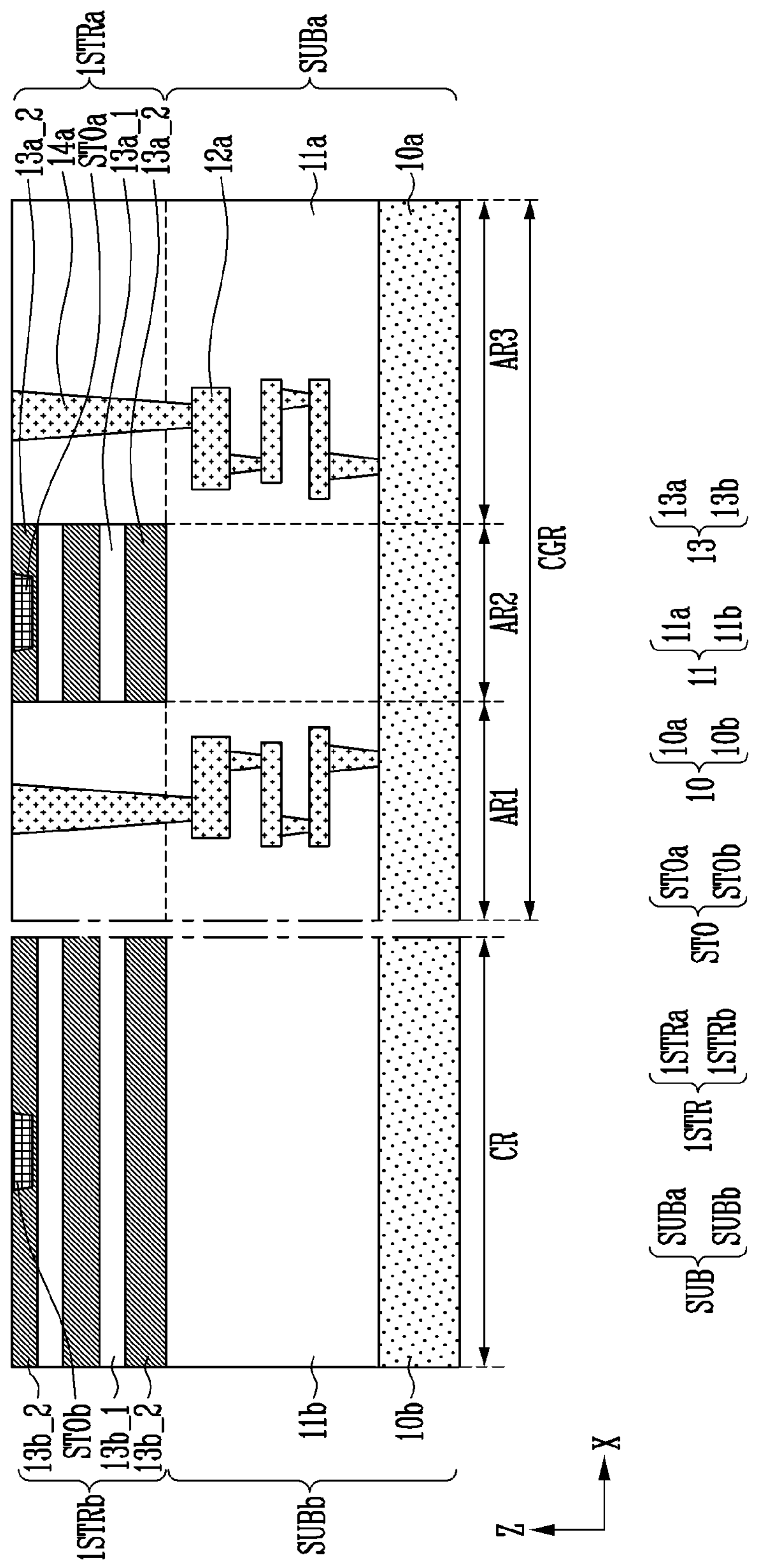

Referring to FIG. 12, in the first region AR1 and the third region AR3, a plurality of upper connection structures 14*a* may be formed by filling the plurality of first vertical holes 2VHC with third material layers. The third material layers may be formed of the same material as the lower connection structures 12*a*. The third material layers may be formed of a material containing tungsten (W).

Figure 13:
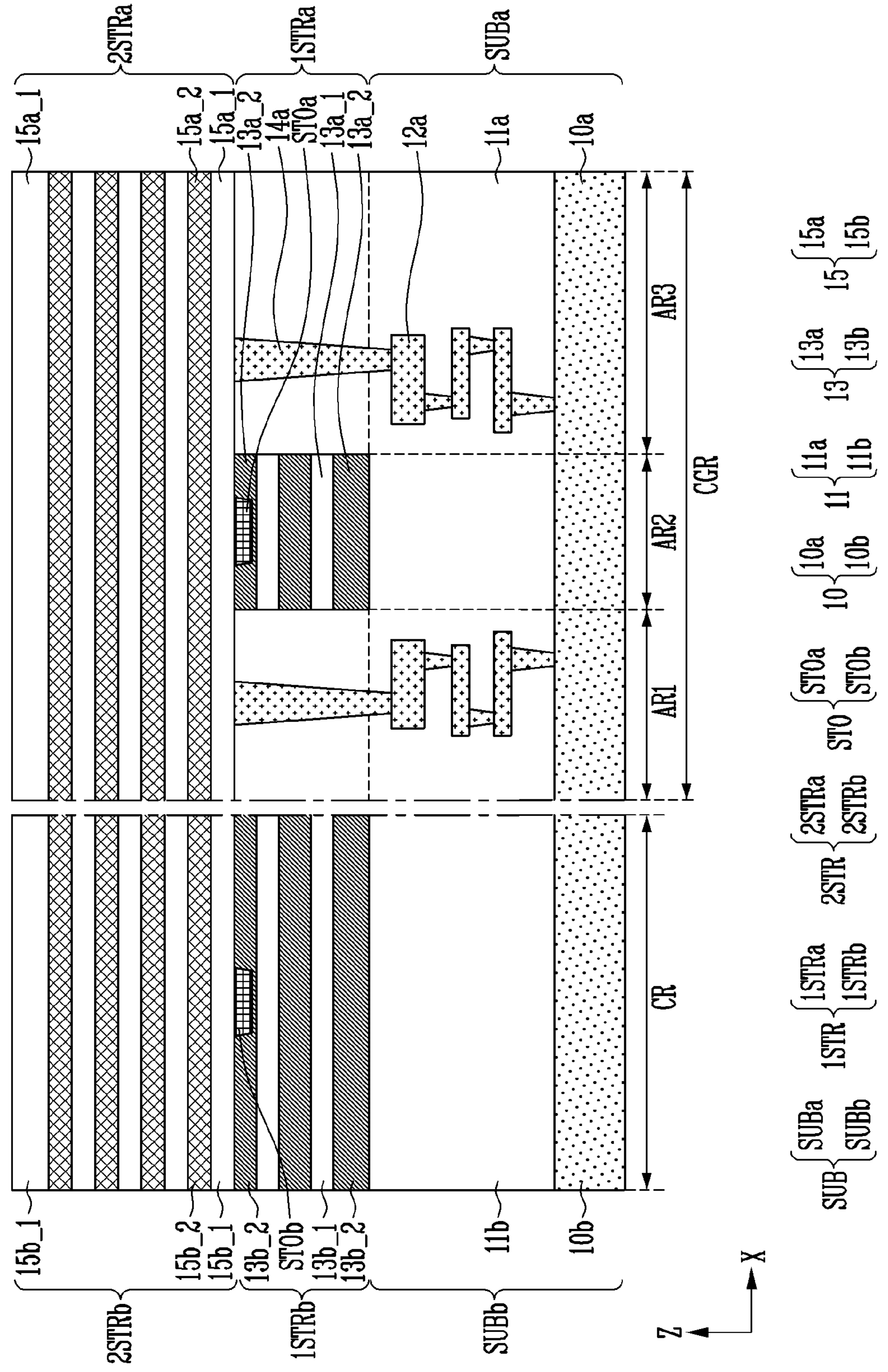

Referring to FIG. 13, an upper stack structure 2STR may be formed on the lower stack structure 1STR. The upper stack structure 2STR may include upper insulating layers 15_1 and upper material layers 152, which are alternately stacked. For example, the upper insulating layers 151 may be identical to the lower insulating layers 13_1, and the upper material layers 152 may be identical to the lower material layers 13_2.

The upper insulating layers 15_1 may be used to insulate gate electrodes (formed in a subsequent process) from each other, and the upper material layers 15_2 may be used to form gate electrodes of a memory cell, a select transistor, and the like. The upper insulating layers 15_1 and the upper material layers 15_2 may be formed of materials having etch selectivities that are equal to or similar to each other. For example, the upper insulating layers 15_1 may be sacrificial layers including nitride and the like, and the upper material layers 15_2 may be insulating layers including oxide and the like. For example, an upper insulating layer 15_1 may be formed at an uppermost end of the upper stack structure 2STR.

Figure 14:
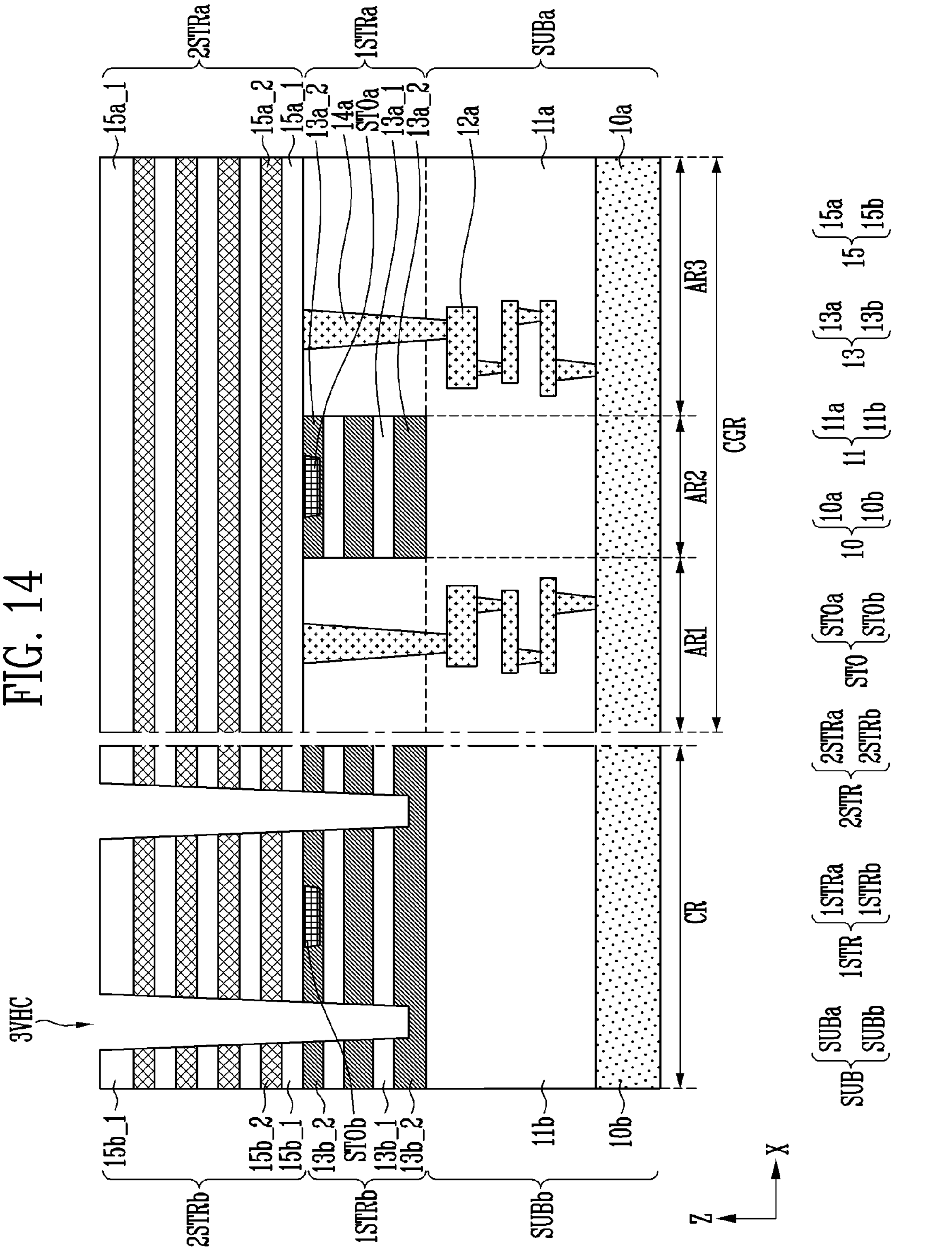

Referring to FIG. 14, a plurality of second vertical holes 3VHC that penetrate second upper insulating layers 15*b*_1 and second upper material layers 15*b*_2 in the vertical direction (e.g., the Z direction) may be formed in a second upper stack structure 2STRb in which the cell region CR is defined. For example, the plurality of second vertical holes 3VHC may be formed by etching portions of the second upper insulating layers 15*b*_1 and the second upper material layers 15*b*_2, forming the second upper stack structure 2STRb. The second vertical hole 3VHC may be formed through a process of forming a mask pattern (not shown) in which an opening is formed on the top of a second upper insulating layer 15*b*_1 that is formed at an uppermost end of the second upper stack structure 2STRb and etching the second upper stack structure 2STRb that is exposed through the opening. The etching process may be performed until a second lower insulating layer 13*b*_1 that is located at a lowermost end of the second lower structure SUBb is exposed. The plurality of second vertical holes 3VHC that is formed in the cell region CR may be formed to form a plurality of vertical plugs CH.

Figure 15:
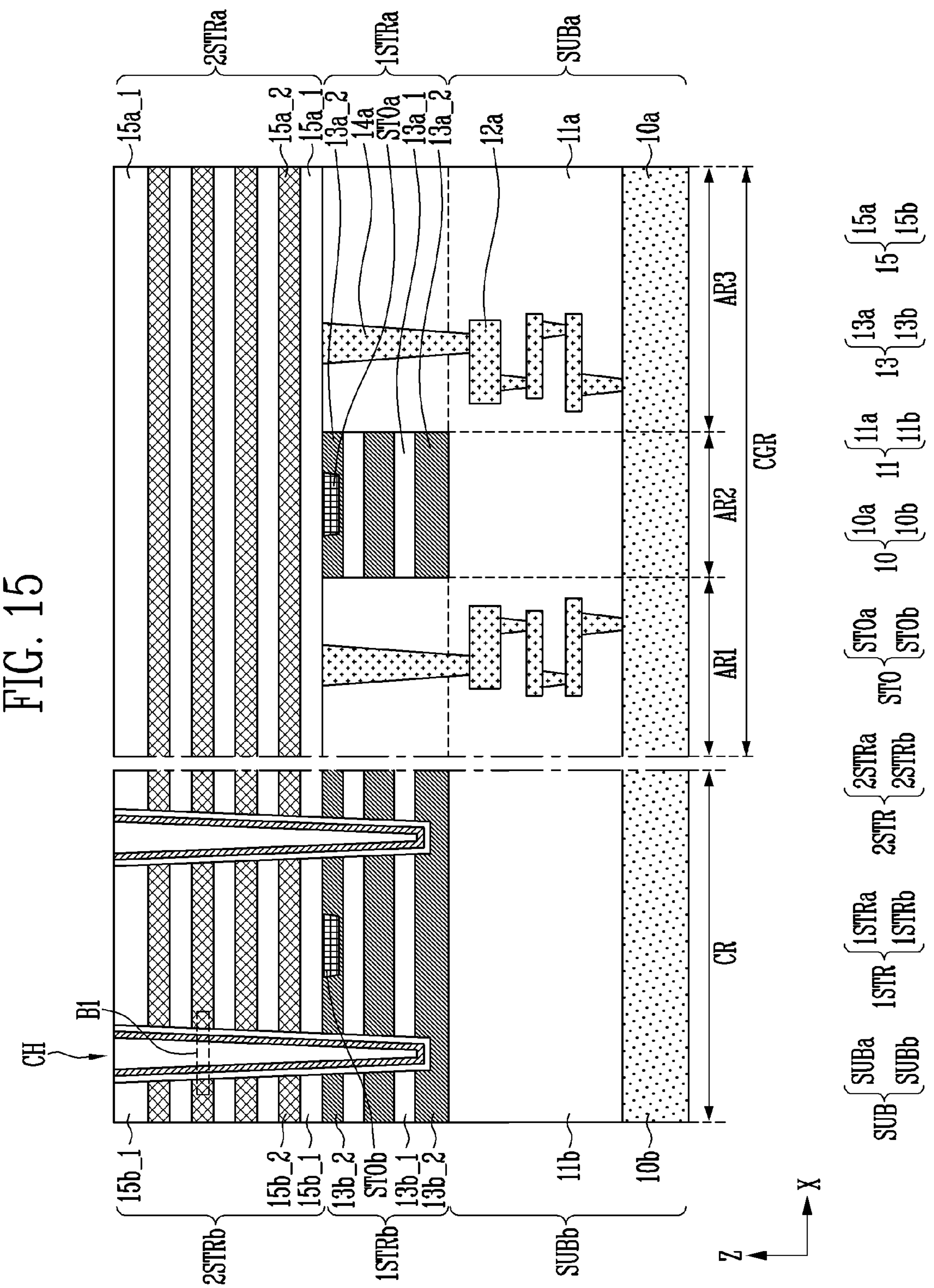
Figure 16:
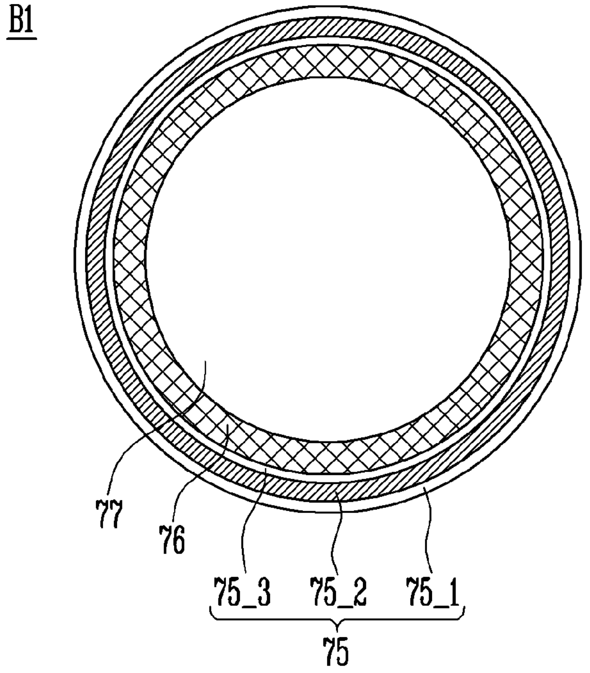

Referring to FIGS. 15 and 16, the plurality of vertical plugs CH may be respectively formed in the plurality of second vertical holes 3VHC. Materials constituting the vertical plugs CH may be used as memory cells. A detailed structure and a manufacturing method of the vertical plug CH will be described with reference to FIGS. 15 and 16. FIG. 16 is an enlarged plan view of B1 shown in FIG. 15.

The vertical plug CH may include a memory layer 75, a channel layer 76, and a vertical insulating layer 77, which are sequentially formed along inner walls of the second vertical holes 3VHC.

The memory layer 75 may be a hollow cylindrical shape along the inner walls of the second vertical holes 3VHC. The memory layer 75 may include a blocking layer 75_1, a trap layer 75_2, and a tunnel isolation layer 75_3, which are formed to be sequentially adjacent to the second vertical holes 3VHC. The blocking layer 75_1 may be formed as an insulating layer including oxide and the like. The trap layer 75_2 may be formed of a material in which charges can be trapped. The trap layer 75_2 may be formed of, for example, poly-silicon, nitride, a variable resistance material, a phase change material, or the like. The tunnel isolation layer 753 may be formed as an insulating layer including oxide and the like. Data may be stored in the vertical plugs that are formed in the cell region CR. More specifically, the data may be stored in the trap layer 75_2 of the vertical plugs CH.

The channel layer 76 may be formed in a hollow cylindrical shape along an inner wall of the memory layer 75 and may be formed of poly-silicon. The vertical insulating layer 77 may fill the inside of the channel layer 76 to form a cylindrical shape and may be formed as an insulating layer including oxide and the like. Although not shown in the drawings, in some embodiments, the channel layer 76 may be formed in a cylindrical shape, and therefore, the vertical insulating layer 77 might not be formed.

Figure 17:
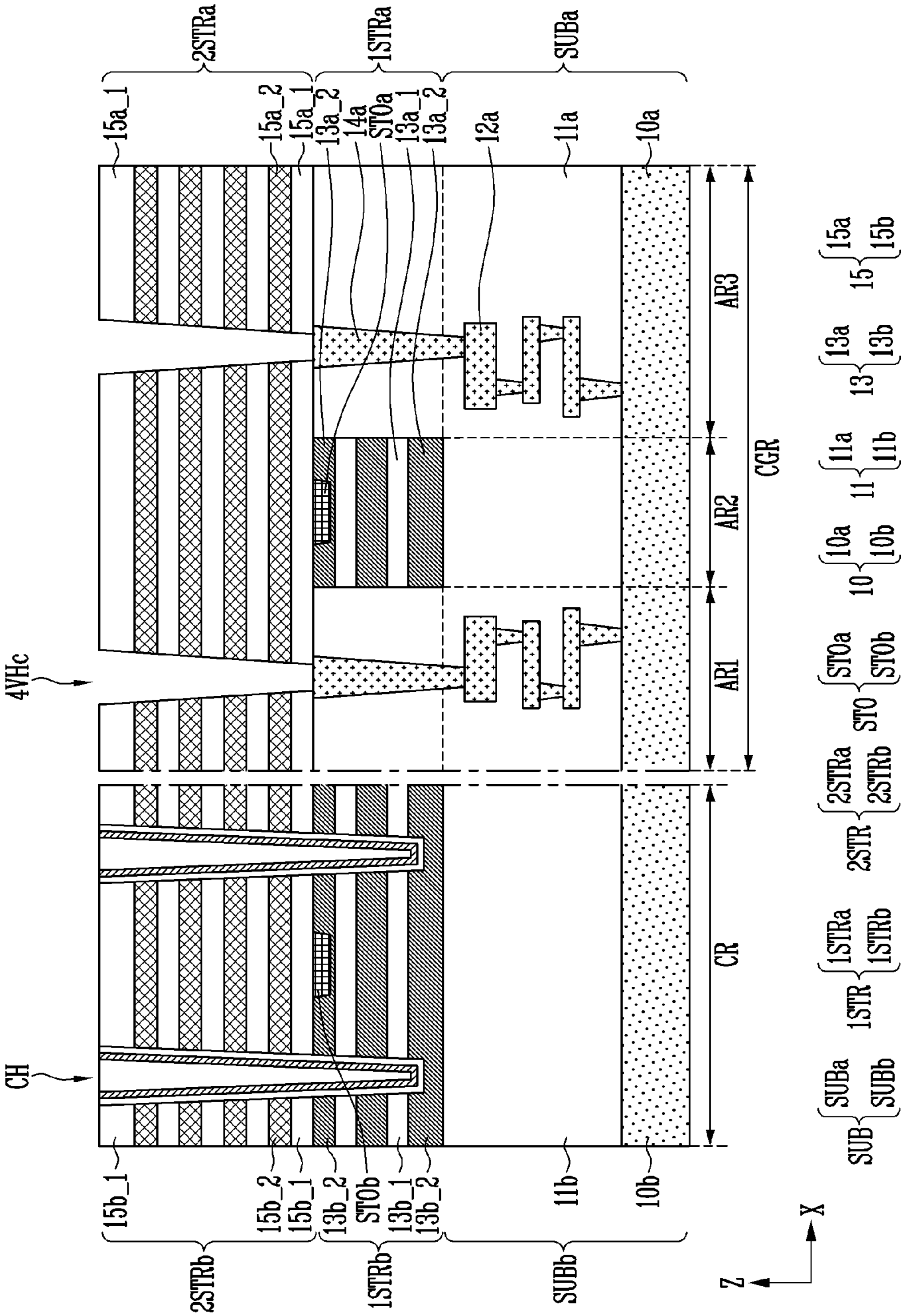

Referring to FIG. 17, a plurality of third vertical holes 4VHC that penetrate a first upper insulating layers 15*a*_1 and a first upper material layers 15*a*_2 in the vertical direction (e.g., the Z direction) may be formed in a first upper stack structure 2STRa in which the chip guard region CGR is defined. For example, the plurality of third vertical holes 4VHC may be formed by etching portions of the first upper insulating layers 15*a*_1 and the first upper material layers 15*a*_2, forming the first upper stack structure 2STRa. The third vertical hole 4VHC may be formed through a process of forming a mask pattern (not shown) in which an opening is formed on the top of a first upper insulating layer 15*a*_1 that is formed at an uppermost end of the first upper stack structure 2STRa and etching the first upper stack structure 2STRa that is exposed through the opening. The etching process may be performed until the upper connection structure 14*a* that is located in the first region AR1 and the second region AR2 of the first lower structure SUBa is exposed. The plurality of third vertical holes 4VHC that are formed in the chip guard region CGR may be formed to form a plurality of chip guards CG.

Figure 18:
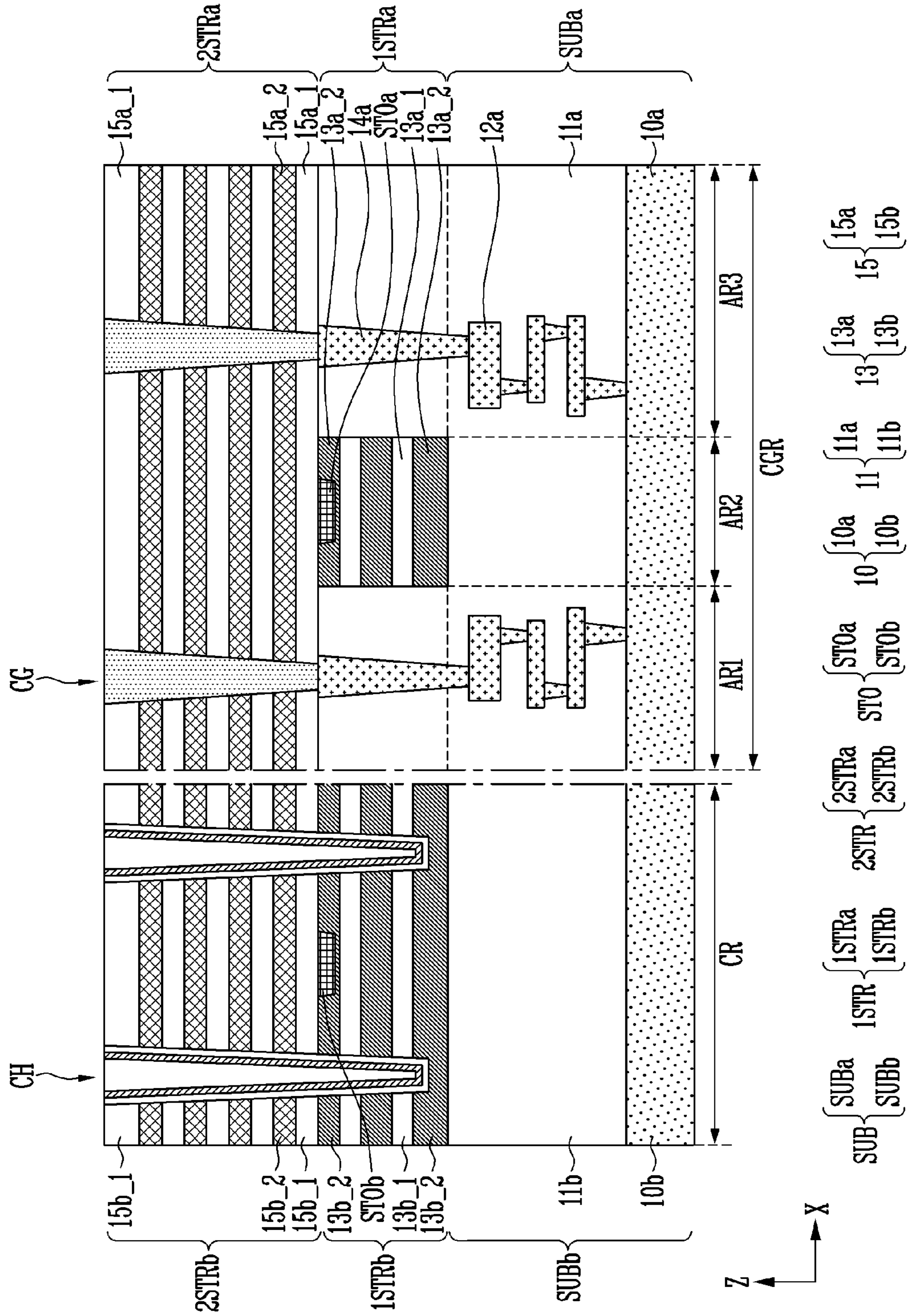

Referring to FIG. 18, in the chip guard region CGR, the plurality of chip guards CG may be formed by filling the plurality of third vertical holes 4VHC with fourth material layers. The fourth material layers may be formed of the same material as the lower connection structures 12*a*. The fourth material layers may be formed of, for example, a material containing tungsten (W).

Figure 19:
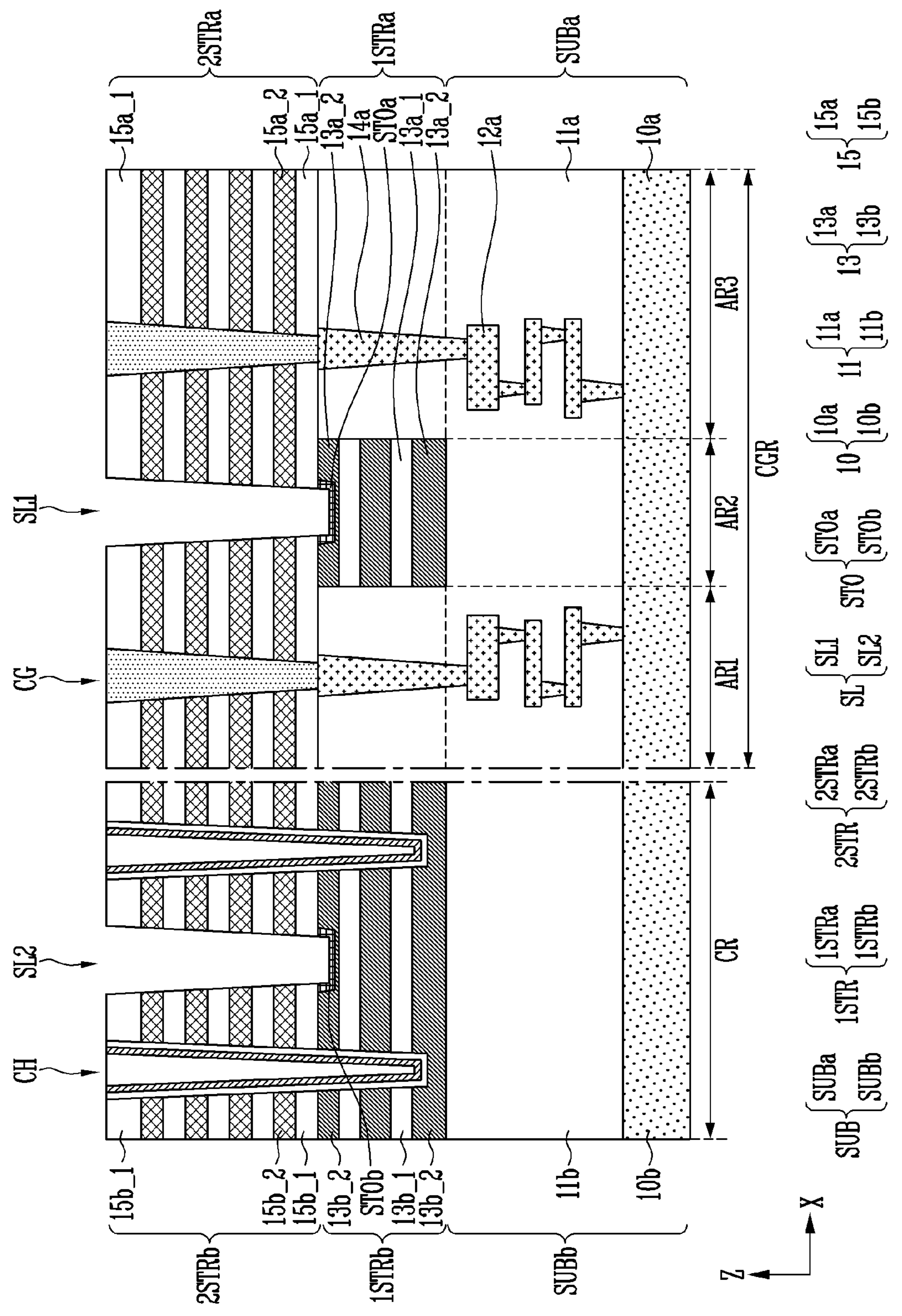

Referring to FIG. 19, a first slit SL1 that penetrates the first upper insulating layers 15*a*_1 and the first upper material layers 15*a*_2 in the vertical direction (e.g., the Z direction) may be formed in the first upper stack structure 2STRa in which the chip guard region CGR is defined, and a second slit SLT2 that penetrates the second upper insulating layers 15*b*_1 and the second upper material layers 15*b*_2 in the vertical direction (e.g., the Z direction) may be formed in the second upper stack structure 2STRb in which the cell region CR is defined. For example, the first slit SL1 may be formed by etching portions of the first upper insulating layers 15*a*_1 and the first upper material layers 15*a*_2, which form the first upper stack structure 2STRa, and the second slit SL2 may be formed by etching portions of the second upper insulating layers 15*b*_1 and the second upper material layers 15*b*_2, forming the second upper stack structure 2STRb. The first slit SL1 may be formed through a process of forming a mask pattern (not shown) in which an opening is formed on the top of a first upper insulating layer 15*a*_1 formed at an uppermost end of the first upper stack structure 2STRa, and etching the first upper stack structure 2STRa that is exposed through the opening, and the second slit SL2 may be formed through a process of forming a mask pattern (not shown) in which an opening is formed on the top of a second upper insulating layer 15*b*_1 that is formed at an uppermost end of the second upper stack structure 2STRb, and etching the second upper stack structure 2STRb that is exposed through the opening. The etching for forming the first slit SL1 may be performed until a portion of the first etch stop layer STOa is exposed, and the etching process for forming the second slit SL2 may be performed until a portion of the second etch stop layer STOb is exposed. The etching process for forming the first slit SL1 and the etching process for forming the second slit SL2 may be simultaneously performed. Accordingly, the first slit SL1 may vertically isolate the first upper stack structure 2STRa into pieces, and the second slit SL2 may vertically isolate the second upper stack structure 2STRb into pieces.

Figure 20:
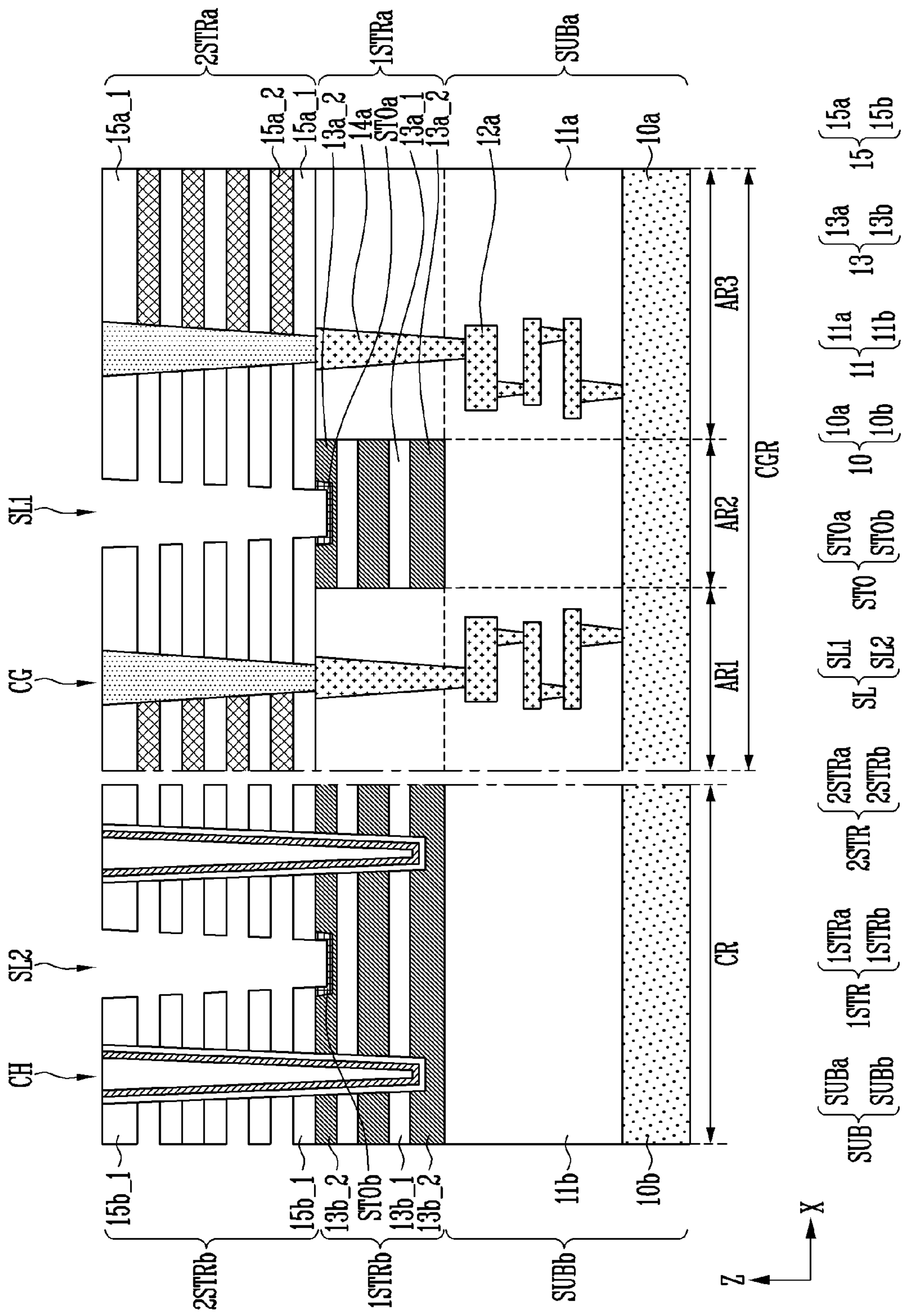

Referring to FIG. 20, an etching process for selectively removing the upper material layers 15_2 that are exposed through a slit SL may be performed. For example, a wet etching process may be performed to selectively remove the upper material layers 15_2 that are formed in the upper stack structure 2STR. For example, only the upper material layers 15*a*_2 that are formed between the chip guard CG and the first slit SL1 may be selectively removed through the etching process in the chip guard region CGR.

Figure 21:
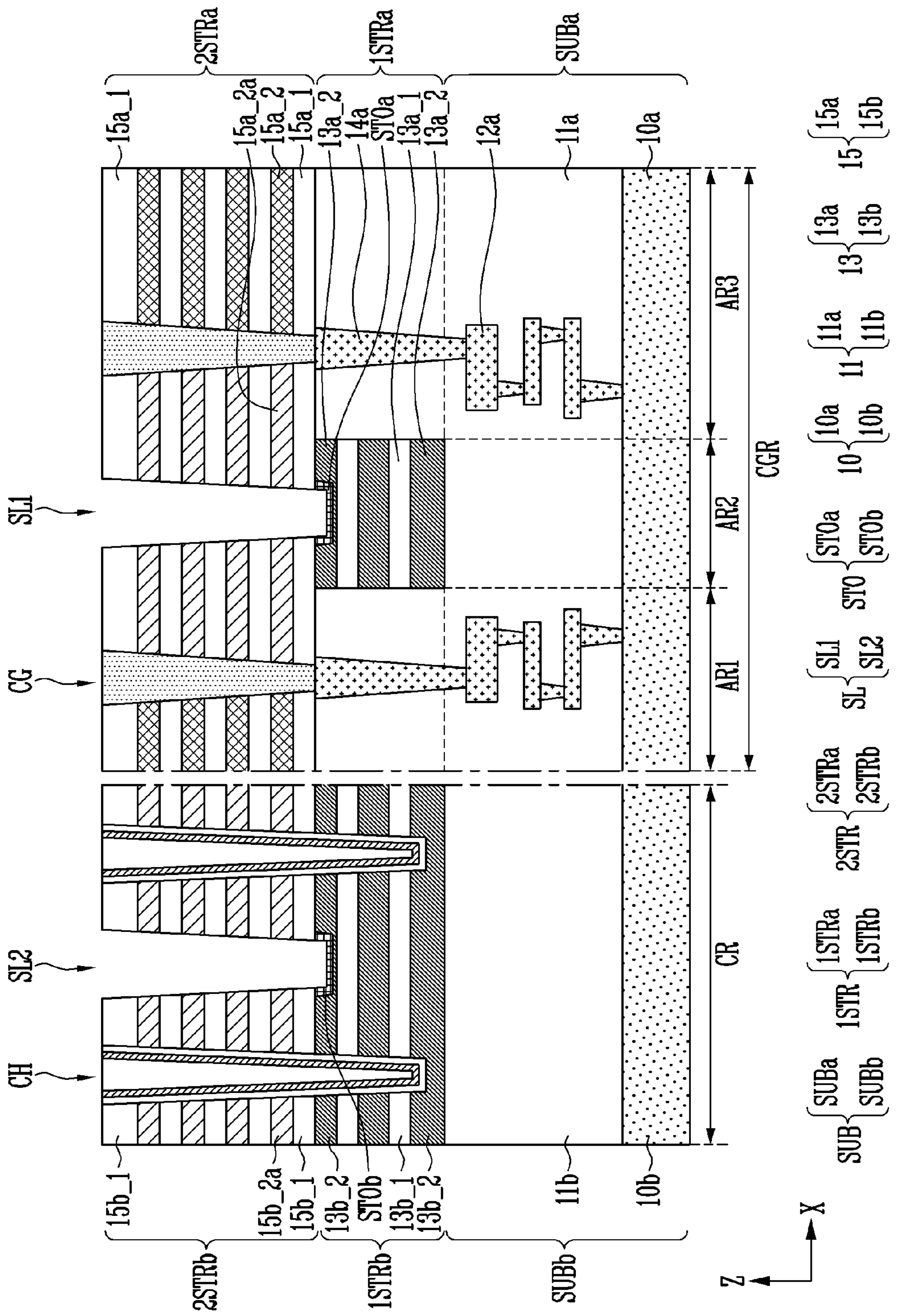

Referring to FIG. 21, conductive layers 15*a*_2*a* for gate lines may be filled in regions in which the upper material layers 15_2 are removed. Since the conductive layers 15*a*_2*a* may be used for word lines or select lines, the conductive layers 15*a*_2*a* may be formed as layers including at least one of tungsten (W), cobalt (Co), nickel (Ni), molybdenum (Mo), silicon (Si), and poly-silicon (poly-Si).

Figure 22:
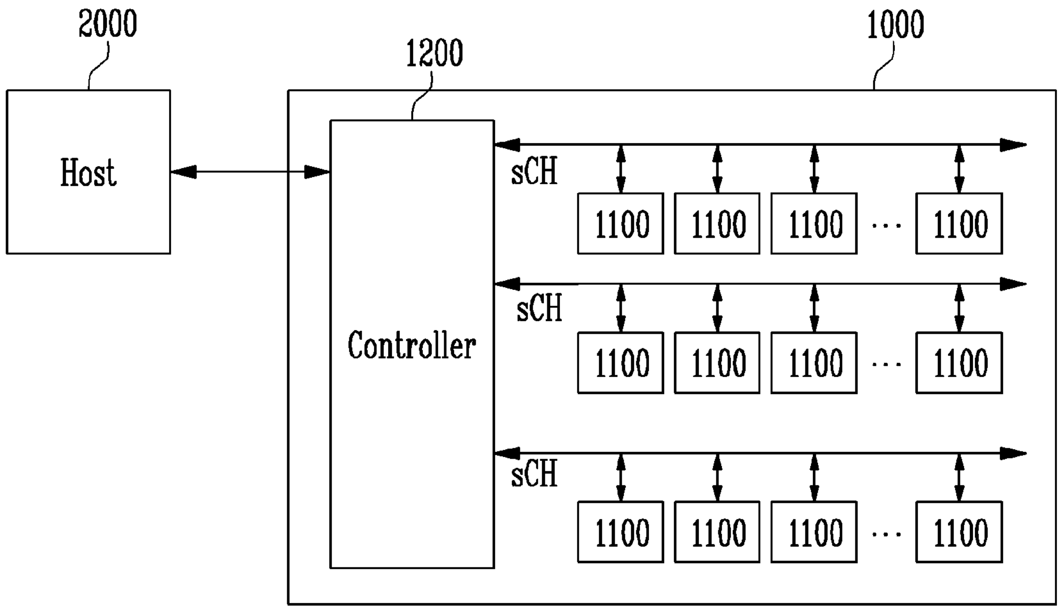
FIG. 22 is a diagram illustrating an embodiment of a memory system including the semiconductor memory device in accordance with the embodiment of the present disclosure.

FIG. 22 is a diagram illustrating an embodiment of a memory system including the semiconductor memory device in accordance with the embodiment of the present disclosure.

Referring to FIG. 22, a memory system 1000 may include a plurality of semiconductor memory devices 1100 in which data is stored and a controller 1200 communicating between the semiconductor memory devices 1100 and a host 2000.

Each of the semiconductor memory devices 1100 may be the semiconductor memory device described in the above-described embodiment.

The semiconductor memory devices 1100 may be connected to the controller 1200 through a plurality of system channels sCH. For example, a plurality of semiconductor memory devices 1100 may be connected to one system channel sCH, and the plurality of system channels sCH may be connected to the controller 1200.

The controller 1200 may communicate between the host 2000 and the semiconductor memory devices 1100. The controller 1200 may control the semiconductor memory devices 1100 according to a request of the host 2000 or may perform a background operation for improving the performance of the memory system 1000 without any request of the host 2000.

The host 2000 may generate requests for various operations and may output the generated requests to the memory system 1000. For example, the requests may include a program request capable of controlling a program operation, a read request capable of controlling a read operation, an erase request capable of controlling an erase operation, and the like. The host 2000 may communicate with the memory system 1000 through various interfaces such as Peripheral Component Interconnect-Express (PCI-E), Advanced Technology Attachment (ATA), Serial ATA (SATA), Parallel ATA (PATA), Serial Attached SCSI (SAS), or Non-Volatile Memory Express (NVMe), a Universal Serial Bus (USB), a Multi-Media Card (MMC), an Enhanced Small Disk Interface (ESDI), and Integrated Drive Electronics (IDE).

Figure 23:
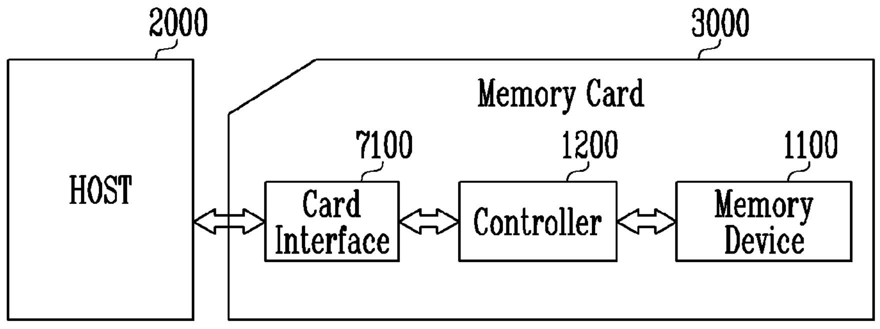
FIG. 23 is a diagram illustrating another embodiment of the memory system including the semiconductor memory device in accordance with the embodiment of the present disclosure.

FIG. 23 is a diagram illustrating another embodiment of the memory system including the semiconductor memory device in accordance with the embodiment of the present disclosure.

Referring to FIG. 23, a memory system may be implemented as a memory card 3000. The memory card 3000 may include a semiconductor memory device 1100, a controller 1200, and a card interface 7100.

The controller 1200 may control data exchange between the semiconductor memory device 1100 and the card interface 7100. In some embodiments, the card interface 7100 may be a secure digital (SD) card interface or a multi-media card (MMC) interface, but the present disclosure is not limited thereto.

The card interface 7100 may facilitate data exchange between a host 2000 and the controller 1200 according to a protocol of the host 2000. In some embodiments, the card interface 7100 may support a universal serial bus (USB) protocol and an inter-chip (IC)-USB protocol. The card interface 7100 may mean hardware capable of supporting a protocol used by the host 2000, software that is embedded in the hardware, or a signal transmission scheme.

When the memory card 3000 is connected to a host interface of the host 2000, such as a PC, a tablet PC, a digital camera, a digital audio player, a cellular phone, console video game hardware, or a digital set-top box, the host interface may perform data communication with the semiconductor memory device 1100 through the card interface 7100 and the controller 1200 under the control of a microprocessor of the host 2000.

In accordance with the present disclosure, abnormal oxidation of lines that are disposed at a lower portion of a chip guard region is prevented so that the reliability of the semiconductor memory device can be improved.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made based on the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein.

What is claimed is:

1. A semiconductor memory device comprising:

a lower structure in which a cell region and a chip guard region are defined, wherein the cell region and the chip guard region are divided along a first direction;

a first lower stack structure formed on the lower structure in the chip guard region, the first lower stack structure including a plurality of first lower material layers, the first lower stack structure including a first etch stop layer formed along an edge thereof;

a first upper stack structure formed on the first lower stack structure in the chip guard region, the first upper stack structure including a plurality of first upper material layers; and a first slit penetrating the first upper stack structure to expose the first etch stop layer in the chip guard region;

a second lower stack structure formed on the lower structure in the cell region, the second lower stack structure including a plurality of second lower material layers, the second lower stack structure including a second etch stop layer formed along an edge thereof;

a second upper stack structure formed on the second lower stack structure in the cell region, the second upper stack structure include a plurality of second upper material layers; and a second slit penetrating the second upper stack structure to expose the second etch stop layer in the cell region;

wherein the plurality of first lower material layers includes at least one of a doped silicon and an undoped silicon.

2. The semiconductor memory device of claim 1, comprising a plurality of chip guards penetrating the first upper stack structure in the chip guard region.

3. The semiconductor memory device of claim 2, wherein the chip guard region includes a first region, a second region, and a third region, which are divided along the first direction, and wherein the first lower stack structure is formed in the second region.

4. The semiconductor memory device of claim 3, wherein the first etch stop layer is formed in the second region.

5. The semiconductor memory device of claim 4, wherein, in the second region, the first lower material layer is an insulating layer.

6. The semiconductor memory device of claim 5, wherein, in the first region and the third region, the lower structure includes a plurality of lower connection structures.

7. The semiconductor memory device of claim 6, wherein, in the first region and the third region, the first lower stack structure includes a plurality of upper connection structures, and wherein the upper connection structure is connected to the lower connection structure.

8. The semiconductor memory device of claim 7, wherein the upper connection structure is connected to the chip guard.

9. The semiconductor memory device of claim 1, comprising a plurality of vertical plugs penetrating the second upper stack structure in the cell region.

10. The semiconductor memory device of claim 9, wherein each of the vertical plugs are formed in vertical holes that vertically penetrate the second upper stack structure, the vertical plugs including a memory layer, a channel layer, and a vertical insulating layer, which are sequentially formed along inner walls of the vertical holes.

11. The semiconductor memory device of claim 10, wherein the memory layer includes a blocking layer, a trap layer, and a tunnel isolation layer, which are sequentially formed in a hollow cylindrical shape along the inner walls of the vertical holes.

12. The semiconductor memory device of claim 11, wherein the blocking layer and the tunnel isolation layer are formed as insulating layers, and wherein the trap layer is formed of a material in which charges are trapped.

13. The semiconductor memory device of claim 10, wherein the channel layer is formed as a poly-silicon layer that is formed in a hollow cylindrical shape along an inner wall of the memory layer, and wherein the vertical insulating layer is formed as an oxide layer that is formed in a cylindrical shape within the channel layer.

* * * * *